(12) United States Patent
Spooner et al.

(10) Patent No.: US 6,946,366 B2
(45) Date of Patent: Sep. 20, 2005

(54) METHOD AND DEVICE FOR PROTECTING MICRO ELECTROMECHANICAL SYSTEMS STRUCTURES DURING DICING OF A WAFER

(75) Inventors: Timothy R. Spooner, Dunstable, MA (US); David S. Courage, Methuen, MA (US); Brad Workman, Needham, MA (US)

(73) Assignee: Analog Devices, Inc., Norwood, MA (US)

( * ) Notice: Subject to any disclaimer, the term of this patent is extended or adjusted under 35 U.S.C. 154(b) by 261 days.

(21) Appl. No.: 10/006,966

(22) Filed: Dec. 5, 2001

(65) Prior Publication Data

US 2002/0081816 A1 Jun. 27, 2002

Related U.S. Application Data

(60) Provisional application No. 60/251,287, filed on Dec. 5, 2000, and provisional application No. 60/251,288, filed on Dec. 5, 2000.

(51) Int. Cl.[7] ............................ H01L 21/46; H01L 21/50
(52) U.S. Cl. ........................ 438/460; 438/110; 438/462; 438/464
(58) Field of Search ......................... 438/106, 107, 438/110, 113, 114, 118, 455, 456, 458, 460, 462, 464, 465

(56) References Cited

U.S. PATENT DOCUMENTS

| | | | |
|---|---|---|---|
| 4,791,075 A | 12/1988 | Lin | |
| 4,907,065 A | 3/1990 | Sahakian | |
| 5,150,196 A | 9/1992 | Yamamoto et al. | |
| 5,323,051 A | 6/1994 | Adams et al. | |
| 5,362,681 A | 11/1994 | Roberts, Jr. et al. | |
| 5,435,876 A | 7/1995 | Alfaro et al. | |
| 5,610,431 A | 3/1997 | Martin | |
| 5,641,714 A | * 6/1997 | Yamanaka | 438/14 |
| 5,824,177 A | 10/1998 | Yoshihara et al. | |
| 5,831,162 A | 11/1998 | Sparks et al. | |
| 5,888,883 A | * 3/1999 | Sasaki et al. | 438/460 |
| 6,106,735 A | 8/2000 | Kurle et al. | |
| 6,109,113 A | 8/2000 | Chavan et al. | |
| 6,210,514 B1 | 4/2001 | Cheung et al. | |
| 6,410,360 B1 | 6/2002 | Steenberge | |
| 6,426,275 B1 | * 7/2002 | Arisa | 438/464 |
| 6,429,506 B1 | 8/2002 | Fujii et al. | |
| 6,555,417 B2 | 4/2003 | Spooner et al. | |

FOREIGN PATENT DOCUMENTS

| | | |
|---|---|---|
| DE | 199 11 916 A1 | 9/1999 |
| DE | 100 13 067 A1 | 9/2000 |
| JP | 08250454 | 9/1996 |

OTHER PUBLICATIONS

US 6,303,409, 10/2001, Karpman et al. (withdrawn)
Spooner et al., U.S. Appl. No. 10/007,585, filed on Dec. 5, 2001. See claim set.*

* cited by examiner

*Primary Examiner*—Michael Lebentritt
*Assistant Examiner*—Scott B. Geyer
(74) *Attorney, Agent, or Firm*—Gauthier & Connors

(57) ABSTRACT

A wafer cap protects micro electromechanical system ("MEMS") structures during a dicing of a MEMS wafer to produce individual MEMS dies. A MEMS wafer is prepared having a plurality of MEMS structure sites thereon. Upon the MEMS wafer, the wafer cap is mounted to produce a laminated MEMS wafer. The wafer cap is recessed in areas corresponding to locations of the MEMS structure sites on the MEMS wafer. The capped MEMS wafer can be diced into a plurality of MEMS dies without causing damage to or contaminating the MEMS die.

103 Claims, 17 Drawing Sheets

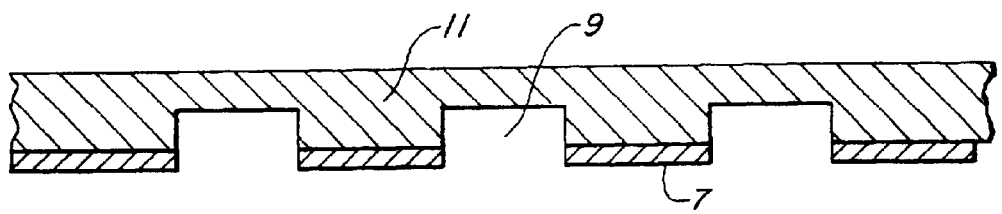
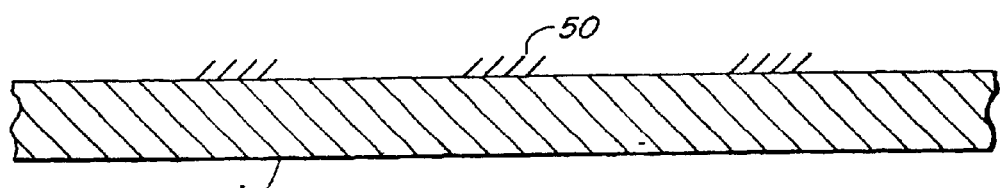
FIG. 6
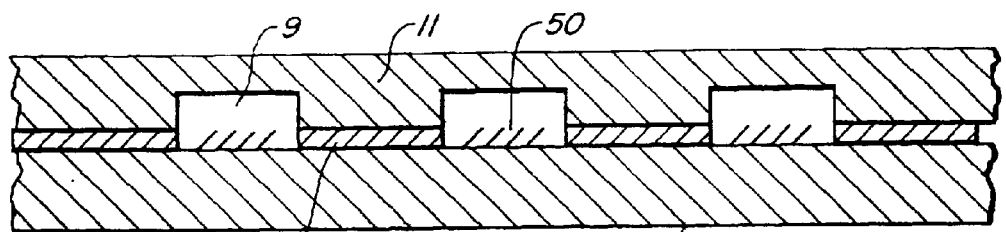
FIG. 7
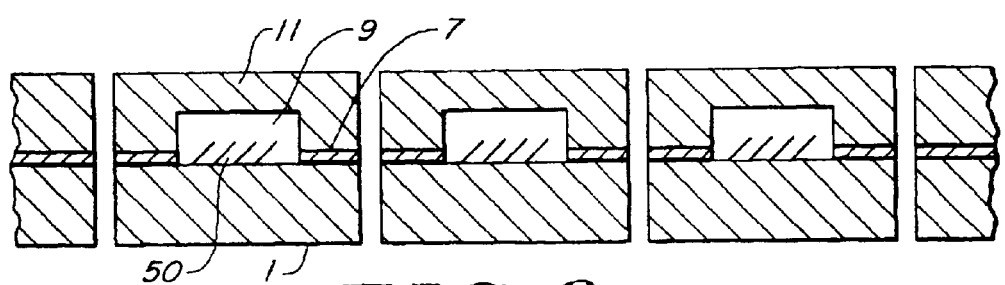
FIG. 8

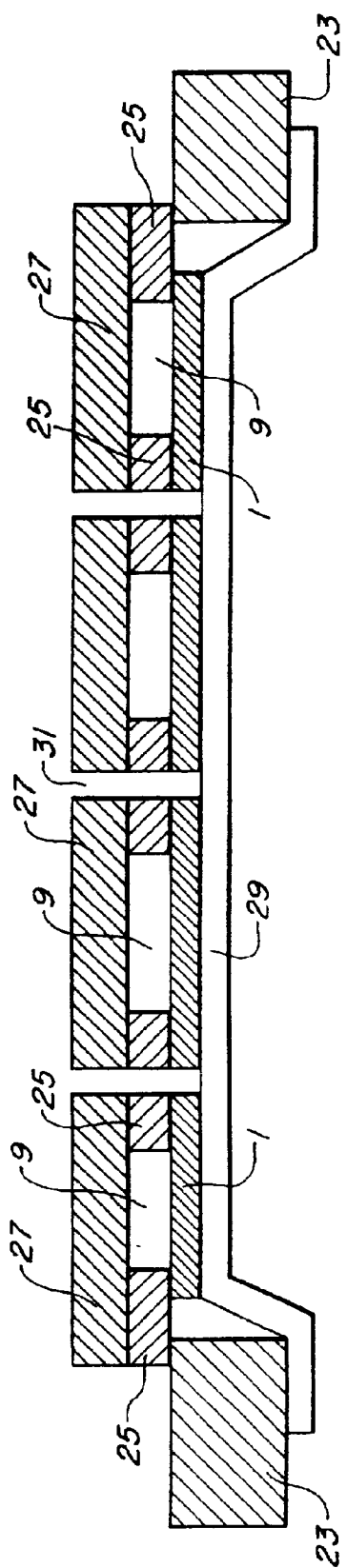
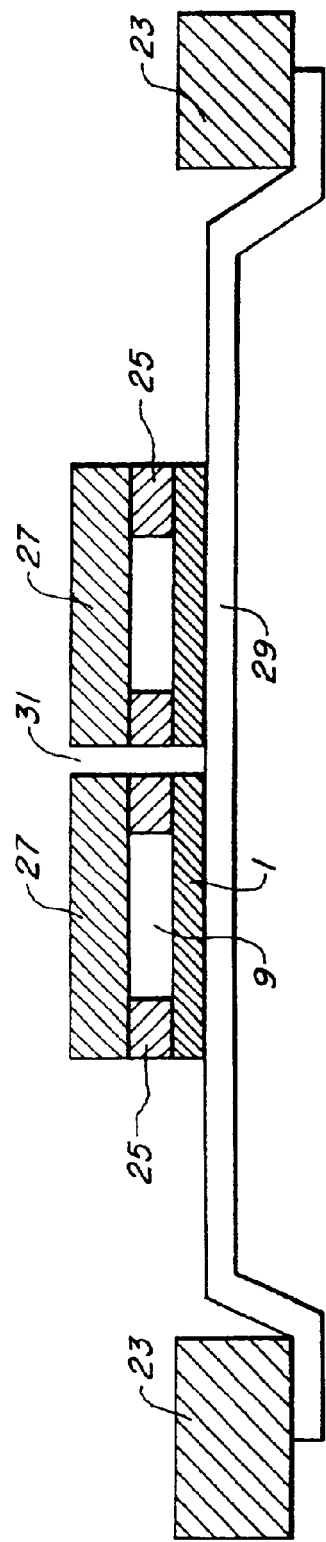

METHOD AND DEVICE FOR PROTECTING MICRO ELECTROMECHANICAL SYSTEMS STRUCTURES DURING DICING OF A WAFER

PRIORITY INFORMATION

This application claims priority from both U.S. Provisional Patent Application, Ser. No. 60/251,287, filed on Dec. 5, 2000 and U.S. Provisional Patent Application, Ser. No. 60/251,288, filed on Dec. 5, 2000.

FIELD OF THE PRESENT INVENTION

The present invention is directed to protecting micro electromechanical systems ("MEMS") structures during dicing of a MEMS wafer to produce individual MEMS dies. More particularly, the present invention is directed to providing a removable wafer cap that is recessed in areas corresponding to locations of individual MEMS structure sites on the MEMS wafer wherein the MEMS wafer, with wafer cap in place, is diced into a plurality of MEMS dies.

BACKGROUND OF THE PRESENT INVENTION

Conventionally, in fabricating MEMS dies for use in the electronics industry, a MEMS wafer is typically fabricated which comprises a plurality of individual MEMS dies commonly arranged in a grid pattern. The sections of a wafer between the individual dies are termed scribe streets.

Scribe streets are areas of the wafer where no component has been placed and which define the boundaries of each individual MEMS die. The MEMS structures appear on only one surface of the wafer. The opposing surface is devoid of structures or patterns. The individual MEMS dies comprising a MEMS wafer are removed from the wafer by sawing through the MEMS wafer along all of the streets, thus physically separating the wafer along both axes into the individual MEMS dies.

One example of standard industry practice for separating wafers into individual dies is described below. First, the wafer is placed upside down (i.e., with the patterned side of the wafer facing downwardly and the non-patterned side facing upwardly) on a flat surface. A metal film frame defining an opening is laid over the wafer with the wafer being within the perimeter of the opening in the film frame. A plastic film is then laid over the metal film frame and back (non-patterned side) of the wafer. Preferably, the plastic film is coated with adhesive on the side that contacts the film frame and the back of the wafer.

Force is then applied between the film and the film frame to cause the film to adhere well to the frame. One possible technique for applying the force is to pass a rolling cylinder over the wafer and film frame to adhere the film to the backside of the wafer and to the surface of the film frame. The wafer is now mounted to the film that, in turn, is mounted to the film frame.

The wafer, film, and film frame combination (hereinafter the "film frame assembly") is then turned over so that the patterned side of the wafer now faces upwards. The film frame assembly is then placed on a movable chuck in a sawing station. The sawing machine typically comprises a camera and a computerized optical system utilizing optical pattern recognition software with movement of the chuck so as to align the streets on the wafer with the saw blade.

This can also be done manually by observing a video image obtained by the camera on a screen and manually adjusting the position of the pallet to the desired location. The chuck and wafer is then advanced under the saw blade to cut through the streets.

Commonly, a wafer has a first plurality of parallel streets aligned in a first direction and a second plurality of parallel streets are aligned orthogonal to the first plurality of streets thus defining a grid with individual dies comprising the blocks between the orthogonal streets. Accordingly, the wafer will be advanced through the saw blade to cut along a street, shifted laterally to the cutting direction a distance equal to the spacing between the parallel streets and advanced through the saw blade to cut the next street. This process is repeated until all of the first plurality of parallel streets are cut.

The chuck and wafer are then rotated 90° and the wafer is advanced through the blade a number of times again to cut through all of the parallel streets in the second orthogonal direction. The saw blade height is adjusted such that it will cut completely through the wafer and contact and score, but not cut through, the film.

The plastic film may be a polyolefin or poly vinyl chloride film of approximately 3 mils in thickness. The blade height would be set, for instance, to cut 1.5 mils into the film. During the sawing process, water is jet sprayed over the surface of the wafer as well as over the surface of the saw blade to cool the wafer and saw blade. After the sawing operation, the wafer is transported to a cleaning station where it can be sprayed with de-ionized water and brushed to clear away any remaining silicon slurry created by the sawing operation.

The wafer typically is then dried after the water flow and brushing operations are completed. The drying may be accomplished in the cleaning station by rapid rotation of the wafer or, alternatively, the wafer may be removed to an oven for heat drying. Other drying options are also, available.

After cleaning, the film frame assembly is transported to a pick-and-place station where the now detached individual dies are to be removed from the film. The pick-and-place station removes the individual dies from the film and places them, for instance, in a carrier. Commonly, the film frame assembly (to which the individual dies are still adhered) is slid into a movable slotted holder in the pick-and-place station that is located above an anvil comprising a needle or needle cluster.

A camera is positioned above the anvil and the film frame assembly to obtain an image of a die on the film frame assembly. The image is processed in an optical pattern recognition system and the position of the film frame assembly is adjusted to line up a die with the anvil. The film frame assembly is then clamped in place and a mechanism grasps the film beyond the perimeter of the wafer and stretches the film radially outward. The stretching of the film serves to reduce the film adhesion to the dies at the edge of the dies, and to create space between the dies. After the stretching operation, the anvil is used to further separate the dies from the film.

The anvil contains a needle or needle cluster that is advanced upwardly to contact the film underneath the selected die, pierce the film and push the die upwards. Also under control of the computer and pattern controls recognition software, an arm having a vacuum-equipped probe is positioned over the top surface of the die. The arm lowers the probe into contact with the die and the vacuum pressure causes the die to attach to the probe. The arm is then controlled to lift the die up and away from the film and transports it over to a grid carrier where the arm descends to position the die in a slot in the carrier and the vacuum is turned off so the die is placed in the carrier.

Typically the pick-and-place station will comprise a second camera positioned to obtain an image of the grid carrier and computer control for assuring that the dies are placed in the appropriate receptacles in the grid carrier. The die can then be delivered to the next station for further processing.

The die may contain any type of micro electromechanical systems structure, such as optical mirrors. The die may also include other circuitry associated with the micro electromechanical systems structure.

When a MEMS die is conventionally fabricated, the circuitry portion of the MEMS die is typically coated with passivation to protect it. However, the micro electromechanical systems structure cannot be passivated since it must be able to move freely.

A micro electromechanical systems structure is positioned essentially in the center of the MEMS die. Due to the fact that the micro electromechanical systems structure is comprised of extremely small sections of polysilicon so that it is resilient, the micro electromechanical systems structure is extremely fragile and great care must be taken during fabrication, up to and including the final packaging steps, not to damage or contaminate the micro electromechanical systems structure.

If a MEMS wafer comprising a set of micro electromechanical systems structure dies was passed through the standard die separation process as described above, the microstructures would be destroyed. The water jet sprays used in a sawing process would destroy the micro electromechanical systems structure. If any of the micro electromechanical systems structures happen to survive the water spray during the sawing operation, the micro electromechanical systems structure would be destroyed during the subsequent spraying and brushing in the cleaning operation. Further, if any of the micro electromechanical systems structures survived those two steps, the micro electromechanical systems structures would be prone to damage in the pick-and-place station by the vacuum-equipped arm, which picks up the MEMS dies and places the MEMS dies in the grid carrier.

In summary, MEMS structures on the surface of a die are very susceptible to damage and particle contamination at all post wafer fabrication process stages. Protection of the MEMS structures from damage and/or contamination during the sawing process is a critical element of the fabrication process. The MEMS die must then be carefully handled and protected before it is processed at the next step that can be in the same building or geographically remote from the dicing process. The MEMS die is also susceptible to damage at the die attach process where the die is placed on a substrate, carrier, or inside a package.

Accordingly, it is desirable to separate the individual MEMS dies from a MEMS wafer containing a plurality of MEMS dies without realizing the problems of the conventional removal processes. It is further desirable to provide a die separating process that protects micro electromechanical systems structures during a dicing of a MEMS wafer to produce individual MEMS dies. Moreover, it is desirable to fabricate a MEMS wafer that provides protection for micro electromechanical systems structures during a dicing of a MEMS wafer to produce individual MEMS dies.

Furthermore, it is desirable to saw the MEMS dies and to use the same protection device used during sawing or dicing for protection during subsequent process steps with removing of the protection device before interconnection of the die. This facilitates the minimization of the effects of handling of the MEMS die during assembly processing and gives protection to the MEMS die during any processing, handling, or transportation.

SUMMARY OF THE PRESENT INVENTION

One aspect of the present invention is a method for protecting a MEMS structure during a dicing of a MEMS wafer to produce individual MEMS dies. The method prepares a MEMS wafer having a plurality of MEMS structure sites thereon; mounts, upon the MEMS wafer, a wafer cap to produce a laminated MEMS wafer, the wafer cap being recessed in areas corresponding to locations of the MEMS structure sites on the MEMS wafer; and dices the laminated MEMS wafer into a plurality of MEMS dies.

Another aspect of the present invention is a method for protecting a MEMS structure during a production of individual MEMS dies. The method fabricates a MEMS wafer having a plurality of MEMS structure sites thereon; fabricates a wafer cap; bonds the wafer cap to the MEMS wafer to produce a laminated MEMS wafer, the wafer cap being recessed in areas corresponding to locations of the MEMS structure sites on the MEMS wafer; dices the laminated MEMS wafer into a plurality of MEMS dies; and removes the wafer cap from the laminated MEMS wafer.

A third aspect of the present invention is a laminated MEMS wafer. The laminated MEMS wafer includes a MEMS wafer having a plurality of MEMS structure sites located thereon and a removable wafer cap. The removable wafer cap is bonded to the MEMS wafer to produce a laminated MEMS wafer. The wafer cap is recessed in areas corresponding to locations of the MEMS structure sites on the MEMS wafer.

A fourth aspect of the present invention is a method for protecting a MEMS structure during a dicing of a MEMS wafer to produce individual MEMS dies. The method prepares a MEMS wafer having a plurality of MEMS structure sites thereon; mounts, using an adhesive layer, a wafer cap, to produce a laminated MEMS wafer, the wafer cap being recessed in areas corresponding to locations of the MEMS structure sites on the MEMS wafer; and dices the laminated MEMS wafer into a plurality of MEMS dies.

A fifth aspect of the present invention is a method for protecting a MEMS structure during a dicing of a MEMS wafer to produce individual MEMS dies. The method prepares a MEMS wafer having a plurality of MEMS structure sites thereon; mounts, upon the MEMS wafer, punched tape, the punched tape having holes in areas corresponding to locations of the MEMS structure sites on the MEMS wafer; mounts, upon the punched tape, a cover tape to produce a laminated MEMS wafer, the cover tape being without openings; and dices the laminated MEMS wafer into a plurality of MEMS dies.

A sixth aspect of the present invention is a method for making a protected MEMS structure. The method prepares a MEMS wafer having a plurality of MEMS structure sites thereon; mounts, upon the MEMS wafer, a spacer layer, the spacer layer being perforated in areas corresponding to locations of the MEMS structure sites on the MEMS wafer; and mounts, upon the spacer layer, a wafer cap to produce a laminated MEMS wafer, the spacer layer having a height to prevent electrostatically induced damage to the MEMS wafer.

A seventh aspect of the present invention is a method for making a protected MEMS structure. The method prepares a MEMS wafer having a plurality of MEMS structure sites thereon; mounts, upon the MEMS wafer, a spacer layer, the spacer layer being perforated in areas corresponding to locations of the MEMS structure sites on the MEMS wafer; and mounts, upon the spacer layer, a wafer cap to produce a laminated MEMS wafer, the spacer layer having a height to prevent damage to the MEMS structures due to the wafer cap coming into physical contact with the MEMS wafer.

An eighth aspect of the present invention is a method for making a protected MEMS structure. The method prepares a MEMS wafer having a plurality of MEMS structure sites thereon; mounts, upon the MEMS wafer, a spacer layer, the spacer layer being perforated in areas corresponding to locations of the MEMS structure sites on the MEMS wafer; and mounts, upon the spacer layer, a wafer cap to produce a laminated MEMS wafer, the spacer layer having a height to prevent electrostatically induced damage to the MEMS wafer and to prevent damage to the MEMS structures due to the wafer cap coming into physical contact with the MEMS wafer.

A ninth aspect of the present invention is a laminated MEMS wafer. The laminated MEMS wafer includes a MEMS wafer having a plurality of MEMS structure sites located thereon; a spacer layer mounted upon the MEMS wafer, the spacer layer being perforated in areas corresponding to locations of the MEMS structure sites on the MEMS wafer; and a wafer cap mounted upon the spacer layer to produce a laminated MEMS wafer. The spacer layer has a height to prevent electrostatically induced damage to the MEMS wafer.

A tenth aspect of the present invention is a laminated MEMS wafer. The laminated MEMS wafer includes a MEMS wafer having a plurality of MEMS structure sites located thereon; a spacer layer mounted upon the MEMS wafer, the spacer layer being perforated in areas corresponding to locations of the MEMS structure sites on the MEMS wafer; and a wafer cap mounted upon the spacer layer to produce a laminated MEMS wafer. The spacer layer has a height to prevent damage to the MEMS structures due to said wafer cap coming into physical contact with the MEMS wafer.

An eleventh aspect of the present invention is a laminated MEMS wafer. The laminated MEMS wafer includes a MEMS wafer having a plurality of MEMS structure sites located thereon; a spacer layer mounted upon the MEMS wafer, the spacer layer being perforated in areas corresponding to locations of the MEMS structure sites on the MEMS wafer; and a wafer cap mounted upon the spacer layer to produce a laminated MEMS wafer. The spacer layer has a height to prevent damage to the MEMS structures due to the wafer cap coming into physical contact with the MEMS wafer and to prevent electrostatically induced damage to the MEMS wafer.

A twelfth aspect of the present invention is a method for protecting a MEMS structure during a dicing of a MEMS wafer to produce individual MEMS dies. The method preparing a MEMS wafer having a plurality of MEMS structure sites on a first side and a plurality of through holes on a second side; mounting, upon the first side of the MEMS wafer, a wafer cap to produce a laminated MEMS wafer, the wafer cap being recessed in areas corresponding to locations of the MEMS structure sites on the MEMS wafer; mounting, upon the second side of the MEMS wafer, a layer of dicing tape; and dicing the laminated MEMS wafer into a plurality of MEMS dies.

A thirteenth aspect of the present invention is a method for protecting a MEMS structure during a production of individual MEMS dies. The method fabricates a MEMS wafer having a plurality of MEMS structure sites on a first side and a plurality of through holes on a second side; fabricates a wafer cap; bonds the wafer cap to the first side of the MEMS wafer to produce a laminated MEMS wafer, the wafer cap being recessed in areas corresponding to locations of the MEMS structure sites on the MEMS wafer; mounts, upon the second side of the MEMS wafer, a layer of dicing tape; and dices the laminated MEMS wafer into a plurality of MEMS dies.

A fourteenth aspect of the present invention is a laminated MEMS wafer. The laminated MEMS wafer includes a MEMS wafer having a plurality of MEMS structure sites located on a first side and a plurality of through holes located on a second side; a removable wafer cap; and a layer of dicing tape mounted upon the second side of the MEMS wafer. The removable wafer cap is bonded to the first side of the MEMS wafer to produce a laminated MEMS wafer. The wafer cap is recessed in areas corresponding to locations of the MEMS structure sites on the MEMS wafer.

A fifteenth aspect of the present invention is a method for protecting a wafer during dicing. The method mounts, upon a backside of a wafer, a layer of dicing tape, the wafer having a front patterned side and a plurality of etched ports on a backside, the etched ports providing a possible leak path from a backside of the wafer to the front patterned side of the wafer; and dices the wafer into a plurality of dies.

A sixteenth aspect of the present invention is a wafer. The wafer includes a wafer having a front patterned side and a plurality of etched ports on a backside, the etched ports providing a possible leak path from a backside of the wafer to the front patterned side of the wafer; and a layer of dicing tape mounted upon the backside of the wafer.

A seventeenth aspect of the present invention is a method for protecting a MEMS structure during a dicing of a MEMS wafer to produce individual MEMS dies. The method prepares a MEMS wafer having a plurality of MEMS structure sites on a first side and a plurality of through holes on a second side; mounts, upon the first side of the MEMS wafer, a wafer cap to produce a laminated MEMS wafer, the wafer cap being recessed in areas corresponding to locations of the MEMS structure sites on the MEMS wafer; mounts, upon the second side of the MEMS wafer, a layer of dicing tape; dices the laminated MEMS wafer into a plurality of MEMS dies; and mounts, upon the layer of dicing tape, a layer of transfer tape.

An eighteenth aspect of the present invention is a laminated MEMS wafer. The laminated MEMS wafer includes a MEMS wafer having a plurality of MEMS structure sites located on a first side and a plurality of through holes located on a second side; a removable wafer cap; a layer of dicing tape mounted upon the second side of the MEMS wafer; and a layer of transfer tape mounted upon the layer of dicing tape. The removable wafer cap is bonded to the first side of the MEMS wafer to produce a laminated MEMS wafer, the wafer cap being recessed in areas corresponding to locations of the MEMS structure sites on the MEMS wafer.

A nineteenth aspect of the present invention is a method for protecting a wafer during a dicing. The method mounts, upon a backside of a wafer, a layer of dicing tape, the wafer having a front patterned side and a plurality of etched ports on a backside, the etched ports providing a possible leak path from a backside of the wafer to the front patterned side of the wafer; dices the wafer into a plurality of dies; and mounts, upon the diced layer of dicing tape, a layer of transfer tape.

A twentieth aspect of the present invention is wafer. The wafer includes a wafer having a front patterned side and a plurality of etched ports on a backside, the etched ports providing a possible leak path from a backside of the wafer to the front patterned side of the wafer; a layer of dicing tape mounted upon the backside of the wafer; and a layer of transfer tape mounted upon the layer of dicing tape.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein:

FIG. 6 is a graphic illustration of an optical MEMS wafer and a wafer cap according to the concepts of the present invention;

FIG. 7 is a graphic illustration of a capped optical MEMS wafer according to the concepts of the present invention;

FIG. 8 is a graphic illustration of a capped optical MEMS wafer sawed into optical MEMS dies according to the concepts of the present invention;

FIG. 13 is a graphic illustration of a capped MEMS wafer with backing tape sawed into MEMS dies according to the concepts of the present invention;

FIG. 14 is a graphic illustration of a capped MEMS dies with backing tape according to the concepts of the present invention;

DETAILED DESCRIPTION OF THE PRESENT INVENTION

As noted above, the present invention is directed to protecting micro electromechanical systems ("MEMS") structures during a dicing of a MEMS wafer to produce individual MEMS dies by providing a removable wafer cap that is recessed in areas corresponding to locations of individual MEMS structure sites on the MEMS wafer.

Figure 1:
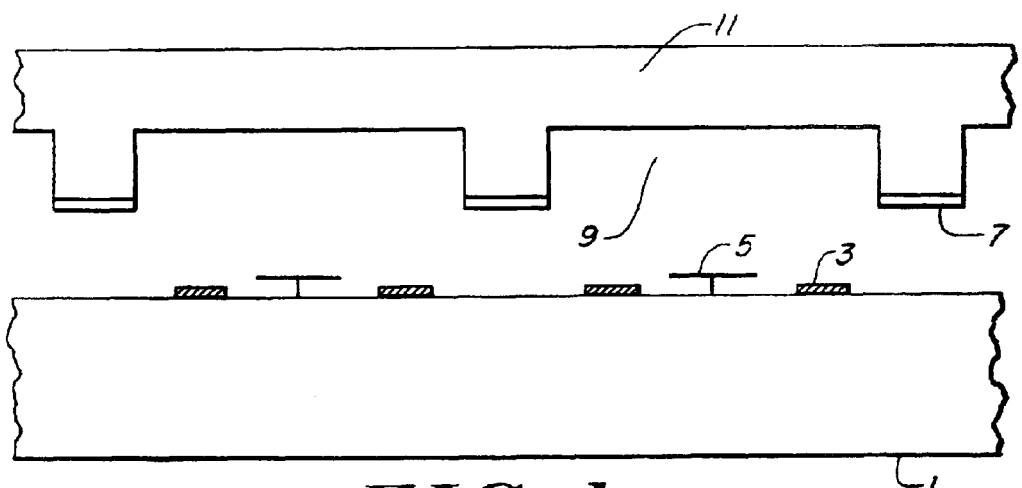
FIG. 1 is a graphic illustration of a MEMS wafer and a wafer cap according to the concepts of the present invention.

FIGS. 1–5 illustrate one process of protecting a MEMS die during a separation and handling process according to the concepts of the present invention. As illustrated in FIG. 1, a MEMS wafer 1 has formed thereon bond sites or pads 3 and MEMS structures 5. In a typical MEMS wafer 1, there could hundreds to thousands of MEMS structure sites, each containing bond sites or pads 3 and MEMS structures 5. FIG. 1 also illustrates a removable wafer cap 11 with adhesive medium 7 and removable wafer cap cavities 9. Each removable wafer cap cavity 9 is formed by recesses in areas of the removable wafer cap 11 corresponding to locations of the MEMS structure sites on the MEMS wafer 1.

The removable wafer cap 11 may include an organic adhesive medium. Also, the removable wafer cap 11 may be constructed from a glass-based material, a silicon-based material, a ceramic-based material, a metal, a static dissipative material, or a polymer-based material, such as, but not limited to, polyolefin, polyvinyl chloride, or polyester.

Figure 2:
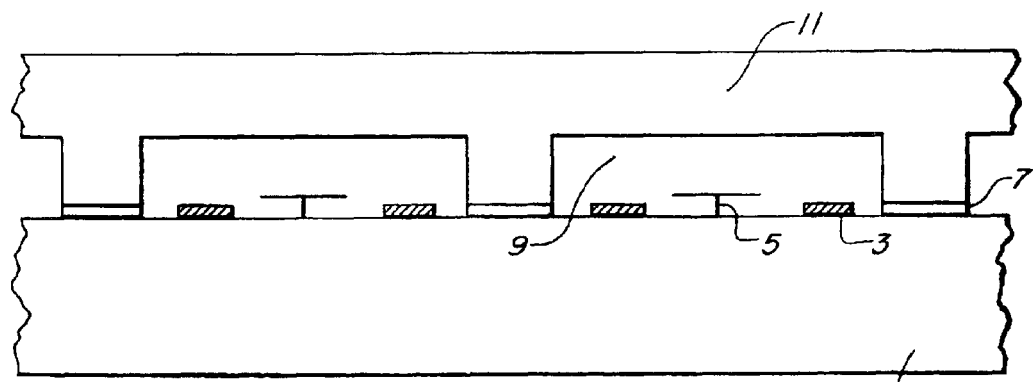
FIG. 2 is a graphic illustration of a capped MEMS wafer according to the concepts of the present invention.

As illustrated in FIG. 2, the removable wafer cap 11 is bonded to the MEMS wafer 1 by the adhesive medium 7. As shown, the removable wafer cap 11 has the cavities 9 located such that the cavities 9 are located over each MEMS structure site containing bond sites or pads 3 and a MEMS structure 5. The adhesive medium 7 may be an ultraviolet light releasable medium, a heat releasable medium, a combination of an ultraviolet light and heat releasable medium, a thermoplastic organic material, an ultraviolet light sensitive organic material, or a solder material. The removable wafer cap 11 may also be bonded to the MEMS wafer 1 through mechanical means or through bonds produced by applying the removable wafer cap 11 to the MEMS wafer 1 with a predetermined amount of pressure.

Figure 3:
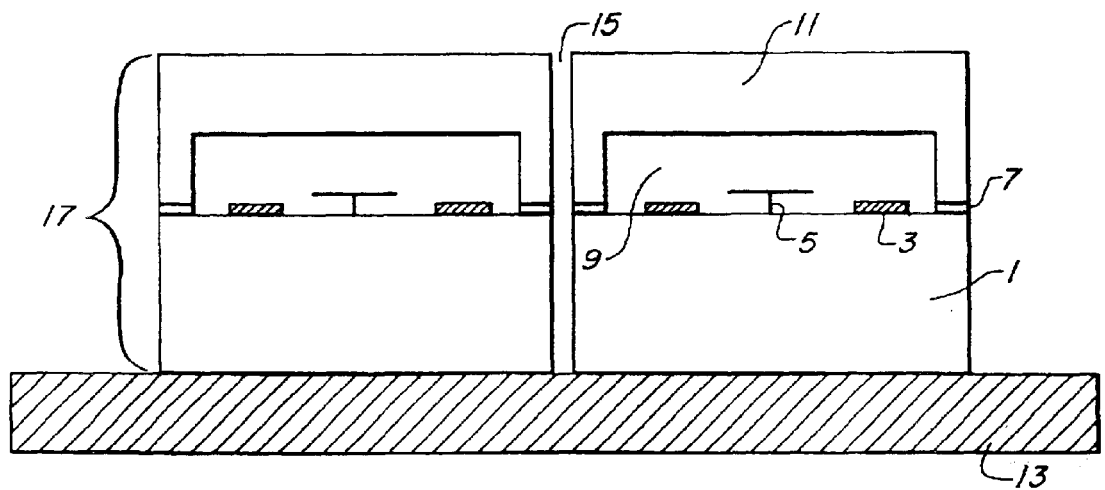
FIG. 3 is a graphic illustration of a capped MEMS wafer sawed into MEMS dies according to the concepts of the present invention.

In FIG. 3, the MEMS wafer 1 with removable wafer cap 11 is mounted on a film frame 13 and subsequently diced to produce a plurality of capped MEMS dies 17. The dicing occurs between MEMS structure sites wherein the film frame 13 is not cut through. The dicing may be realized by using a saw, using a laser, or using scribing and breaking.

Figure 4:
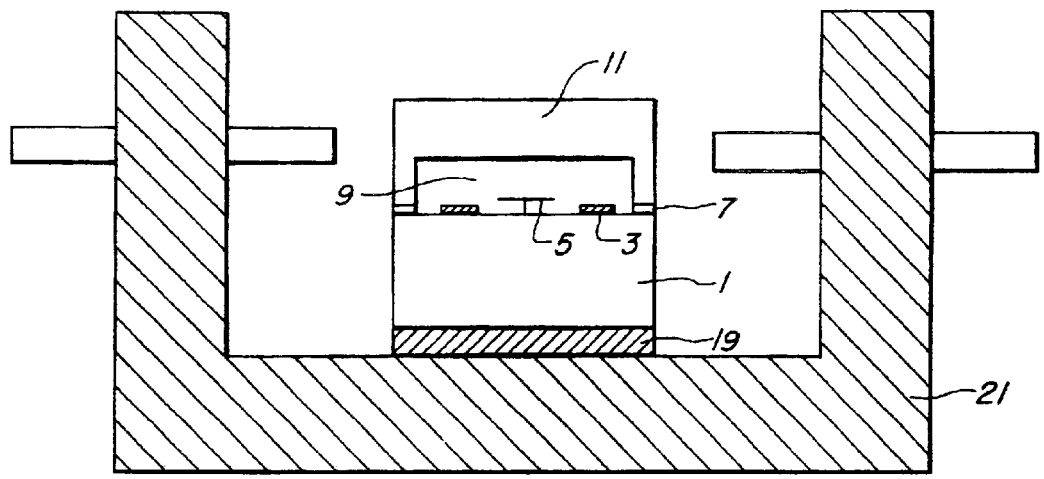
FIG. 4 is a graphic illustration of a capped MEMS die placed in a package according to the concepts of the present invention.
Figure 5:
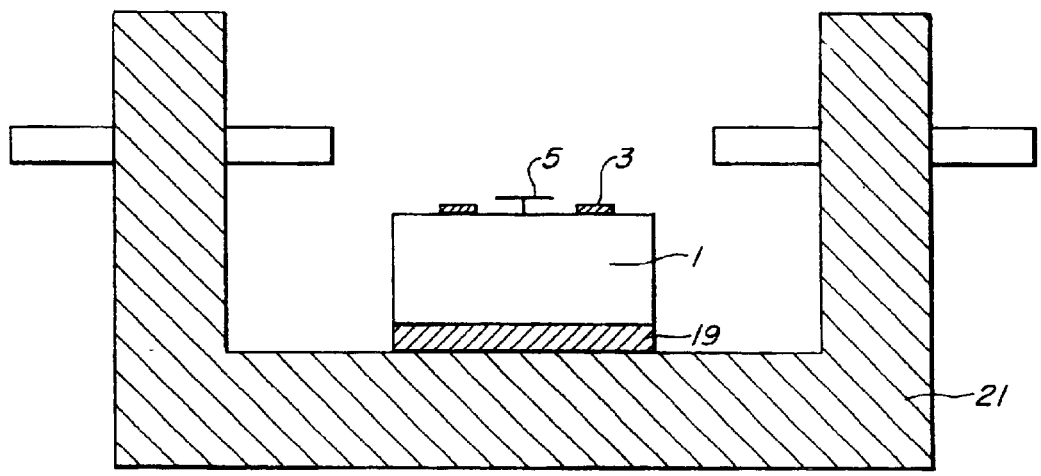
FIG. 5 is a graphic illustration of a MEMS die placed in a package according to the concepts of the present invention.

Individual MEMS dies 17 are removed from the film frame 13 and placed in packages 21, as illustrated in FIG. 4. An adhesive 19 attaches the MEMS die 17 to the package 21. Thereafter, the removable wafer cap 11 is removed while the MEMS die 17 is in the package 21, as illustrated in FIG. 5.

FIGS. 6–10 illustrate one process of protecting an optical MEMS die during a separation and handling process according to the concepts of the present invention. As illustrated in FIG. 6, an optical MEMS wafer 1 has formed thereon bond sites or pads 3 and optical MEMS structures 50. In a typical optical MEMS wafer 1, there could hundreds to thousands of optical MEMS structure sites, each containing bond sites or pads 3 and optical MEMS structures 50. FIG. 1 also illustrates a removable wafer cap 11 with adhesive medium 7 and removable wafer cap cavities 9. Each removable wafer cap cavity 9 is formed by recesses in areas of the removable wafer cap 11 corresponding to locations of the optical MEMS structure sites on the optical MEMS wafer 1.

The removable wafer cap 11 may include an organic adhesive medium. Also, the removable wafer cap 11 may be constructed from a glass-based material, a silicon-based material, a ceramic-based material, a metal, a static dissipative material, or a polymer-based material, such as, but not limited to, polyolefin, polyvinyl chloride, or polyester.

As illustrated in FIG. 7, the removable wafer cap 11 is bonded to the optical MEMS wafer 1 by the adhesive medium 7. As shown, the removable wafer cap 11 has the cavities 9 located such that the cavities 9 are located over each optical MEMS structure site containing bond sites or pads 3 and an optical MEMS structure 50. The adhesive medium 7 may be an ultraviolet light releasable medium, a heat releasable medium, a combination of an ultraviolet light and heat releasable medium, a thermoplastic organic material, an ultraviolet light sensitive organic material, or a solder material. The removable wafer cap 11 may also be bonded to the optical MEMS wafer 1 through mechanical means or through bonds produced by applying the removable wafer cap 11 to the optical MEMS wafer 1 with a predetermined amount of pressure.

In FIG. 8, the optical MEMS wafer 1 with removable wafer cap 11 is diced to produce a plurality of capped optical MEMS dies. The dicing occurs between optical MEMS structure sites. The dicing may be realized by using a saw, using a laser, or using scribing and breaking.

The optical MEMS wafer 1 may also be diced with a wafer saw such that a removable wafer cap side of the optical MEMS wafer 1 faces towards a cutting device of the wafer saw, thereby enabling the removable wafer cap 11 to be sawn before the optical MEMS wafer 1.

Figure 9:
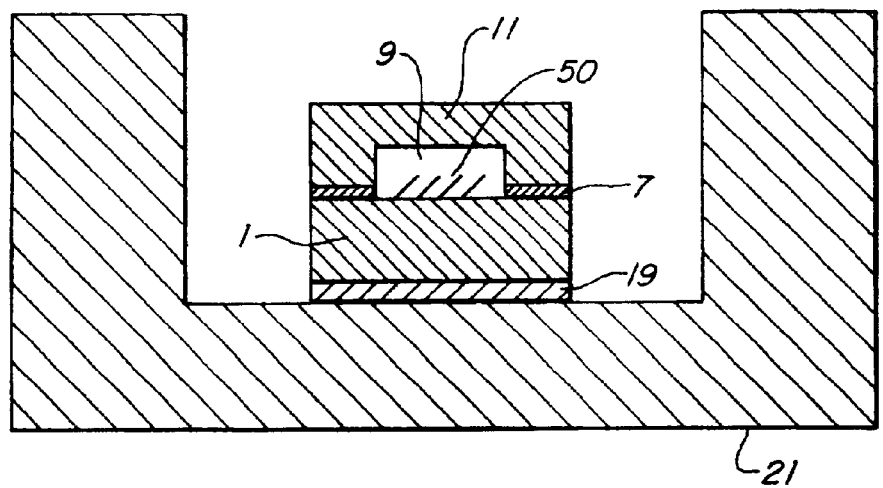
FIG. 9 is a graphic illustration of a capped optical MEMS die placed in a package according to the concepts of the present invention.
Figure 10:
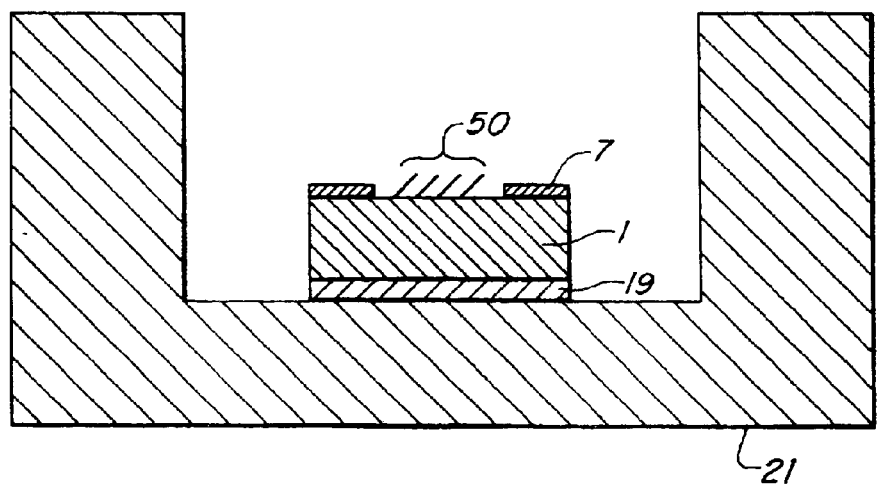
FIG. 10 is a graphic illustration of an optical MEMS die placed in a package according to the concepts of the present invention.

Individual optical MEMS dies are placed in packages 21, as illustrated in FIG. 9. An adhesive 19 attaches the optical MEMS die to the package 21. Thereafter, the removable wafer cap 11 is removed while the optical MEMS die is in the package 21, as illustrated in FIG. 10.

Figure 11:
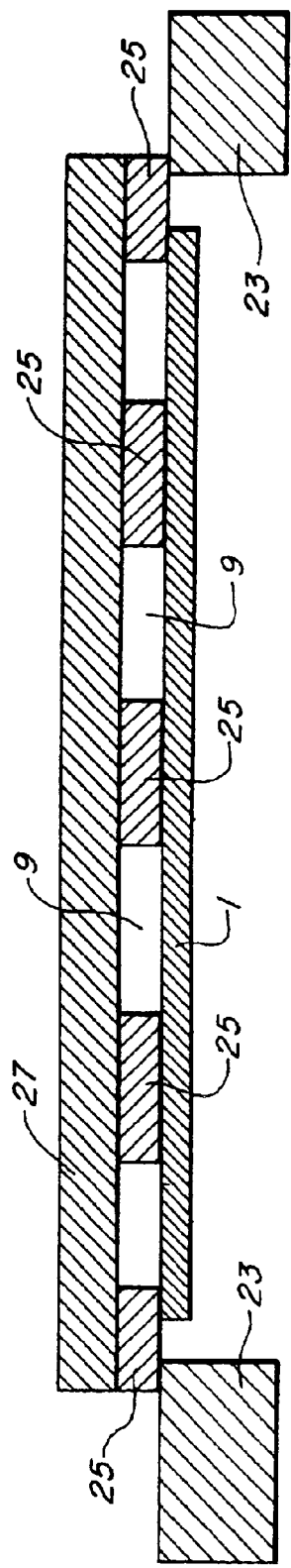
FIG. 11 is a graphic illustration of a MEMS wafer on a carrier ring and a wafer cap according to the concepts of the present invention.

In another embodiment as illustrated in FIG. 11, a face of the MEMS wafer 1 is mounted to a laminated stack of pre-cut contiguous tape 25 with perforations to create a cavity around the MEMS element 9. The laminated stack of pre-cut contiguous tape is also adhered to a metal film frame 23. An adhesive medium is between the wafer 1 and both the laminated stack of pre-cut contiguous tape 25 and the film frame 23. This adhesive can be a UV releasable medium, a heat releasable medium, a combination of UV and heat releasable or may not have release properties. A layer of tape 27 (wafer cap) is adhered to the laminated stack of pre-cut contiguous tape to enclose the cavities over the MEMS elements 9. Alternatively, the laminated stack of pre-cut contiguous tape 25 is not necessary if the wafer has sufficient recessed cavities around the MEMS elements 9 fabricated into the structure of the wafer 1.

Figure 12:
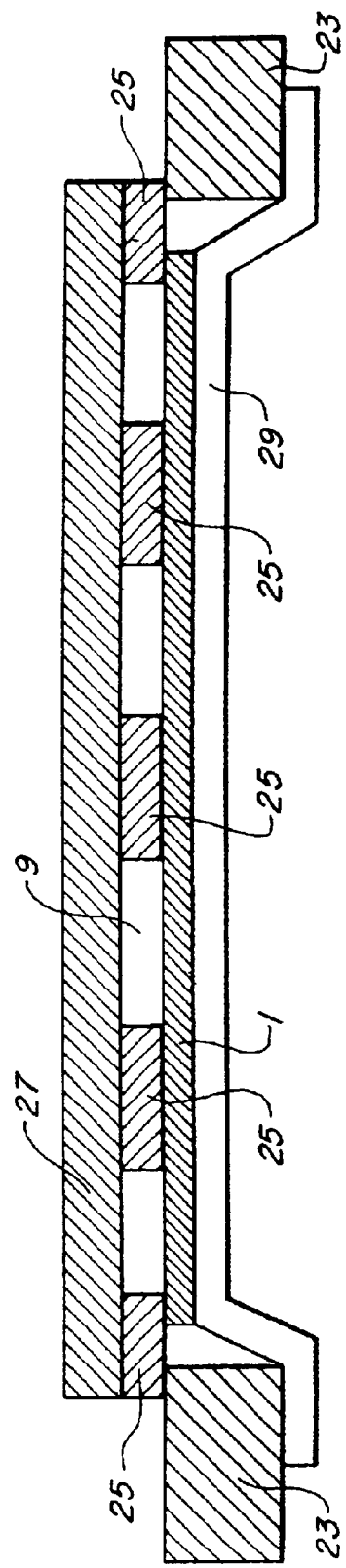
FIG. 12 is a graphic illustration of a capped MEMS wafer on a carrier ring with backing tape according to the concepts of the present invention.

A contiguous backing tape 29 (possibly UV or heat curable or a combination thereof) is placed on the back side of the wafer 1 and adhered to the wafer ring 23, illustrated in FIG. 12. The wafer 1 can then, in a preferred embodiment, be sawn on a wafer saw with the MEMS side facing up, as illustrated in FIG. 13. The saw cuts through the top laminate or etched tape 27 and through the pillars 25 and wafer 1, but not through the backing tape 29.

The sawn wafer 1 can then be shipped as is or the non-functional dies removed from the backing tape 29, leaving the functional dies remaining on the backing tape surface 29, as illustrated in FIG. 14. At this point the MEMS structure is face up on a carrier ring with a cavity cover or wafer cap 27 over the MEMS structure providing environmental protection to the MEMS structure.

Figure 15:
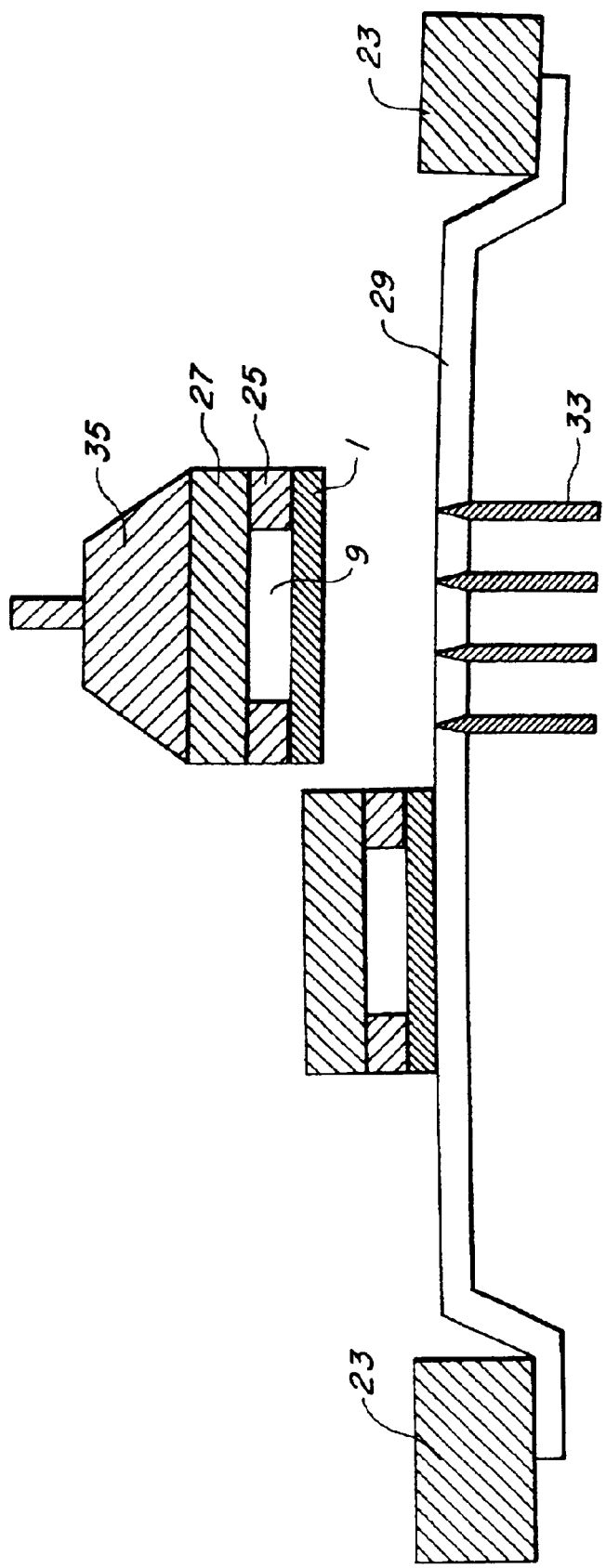
FIG. 15 is a graphic illustration of the removal of a capped MEMS die from the backing tape.
Figure 16:
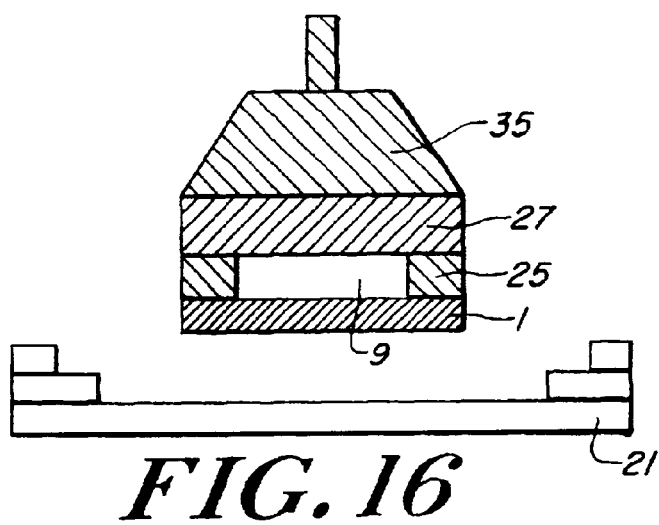
FIG. 16 is a graphic illustration of the placing of a capped MEMS die in a package.
Figure 17:
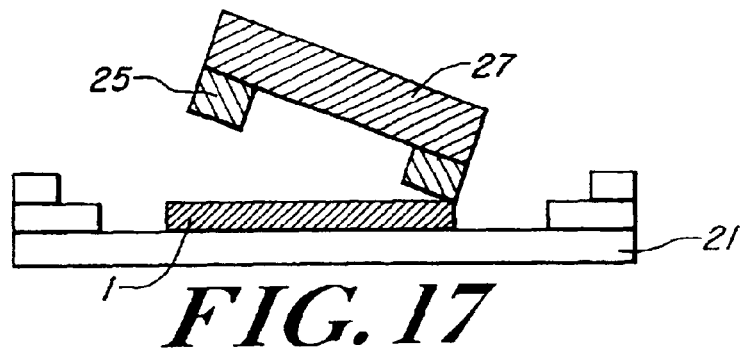
FIG. 17 is a graphic illustration of the removing of the cap from the MEMS die in the package.

The sawn wafer 1 can now be transferred to the next step of the process. The carrier ring 23 can be placed on a die attachment machine and the die picked using a collet 35, as illustrated in FIG. 15, to contact the surface of the top cover 27, therefore not damaging the MEMS die structure. The MEMS die can be released from the backing tape 29 using UV, heat, or eject needles or a combination of these or other release techniques. The MEMS die is then placed in a package using conventional methods, as illustrated in FIG. 16, and is adhered thereto, using conventional adhesives or other fixing techniques. Finally, the cover 27 and laminated stack of pre-cut contiguous tape 25 can now be removed in a number of possible ways. V, Heat, possibly as part of the MEMS die attachment curing process or in some other way, as illustrated in FIG. 17.

Alternatively, the above-described process with respect to FIGS. 11–17, the process of the present invention can just be used to dice the MEMS wafer 1, and the cover tape 27 is removed immediately after wafer is diced. The process can also include a number of alternative steps between MEMS wafer dicing and MEMS die attachment including, but not only, MEMS die inspection through the tape 27. In some cases, the MEMS device may have wirebond pads on the back surface of the die.

Following wafer dicing, another tape could be adhered to the top of the MEMS cover 27 and then the back tape 29 could be removed leaving the back of the die exposed.

The dies could then be processed further, for example, electrical test or bond pad cleaning or bond pad bumping or other possible process steps. The product would then be removed from the tape and die attached using pick and place techniques to turn the die or using some other procedure.

Figure 18:
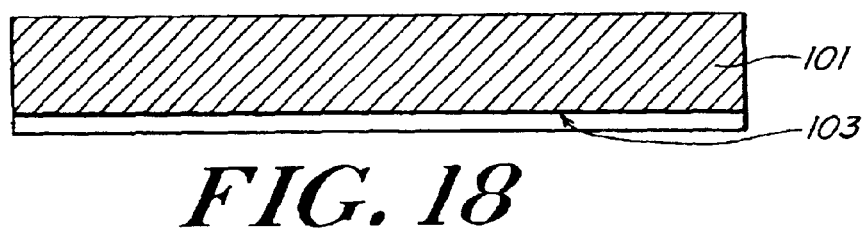
FIG. 18 is a graphical illustration of a spacer layer according to the concepts the present invention.

FIGS. 18–25 illustrate one process of protecting a MEMS die during a separation and handling process according to the concepts of the present invention. As illustrated in FIG. 18, a spacer layer 101 may be realized with an adhesive layer 103.

The spacer layer 101 and adhesive layer 103 may comprise a tape having adhesive on two sides and a flexible film or a flexible film with an adhesive medium on one side. The flexible film may be transmissive to UV radiation and may be about 40 mils thick. The spacer layer and flexible film materials may be static dissipative. The spacer layer 101 and adhesive layer 103 may also comprise a plurality of layers of perforated tape, an aggregate of the plurality of layers of perforated tape producing the height to prevent electrostatically induced damage to the MEMS structures 5 of FIG. 20 and/or prevent a wafer cap 110 of FIG. 21 from deflecting in such a manner to come in contact with the MEMS structures 5 of FIG. 20.

The adhesive layer 103 may be either an adhesive medium or a tape with adhesive on both sides. The adhesive layer 103 may be an ultraviolet light releasable medium, a heat releasable medium, a combination of an ultraviolet light and heat releasable medium, a thermoplastic organic material, an ultraviolet light sensitive organic material, or a solder material.

Figure 19:
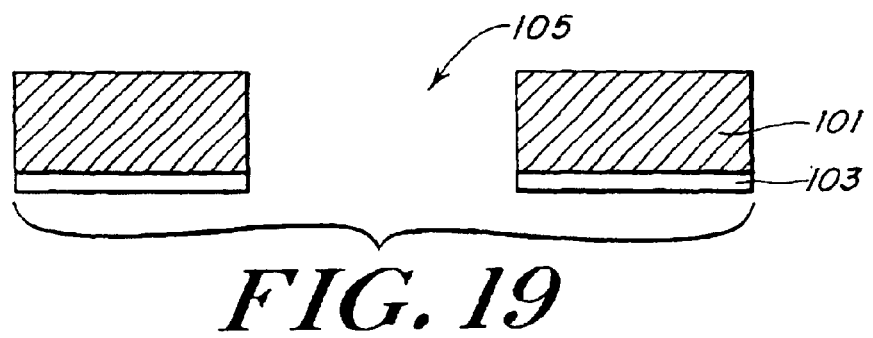
FIG. 19 is another graphical illustration of a spacer layer according to the concepts the present invention.

In FIG. 19, the spacer layer 101 with adhesive layer 103 is cut or punched to produce opening 105 wherein the opening corresponds to an area on a MEMS wafer having MEMS structures so as to provide clearance for surface MEMS structures. The spacer layer 101 and tape 103 may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The spacer layer 101 and tape 103 may also be pre-combined and cut or punched to produce areas corresponding to the MEMS structures on the MEMS wafer; or before being combined, the spacer layer 101 and tape 103 may also be pre-cut or pre-punched to produce areas corresponding to the MEMS structures on the MEMS wafer. The spacer layer 101 and tape 103 may be may be combined using pressure to promote adhesion. If a non-UV reliant adhesive material is used, the holes or openings in the spacer layer may be laser cut when a UV or IR resistive material is used.

Figure 20:
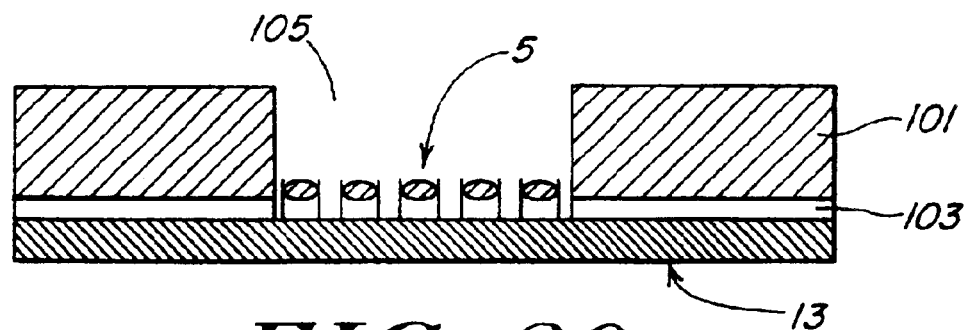
FIG. 20 is a graphic illustration of a MEMS wafer and a spacer layer according to the concepts of the present invention.

FIG. 20 illustrates the bonding of an aligned spacer layer 101 with adhesive layer 103 with a MEMS wafer 13 having MEMS structures 5 and openings 105 corresponding to areas of the MEMS structures 5. The aligned spacer layer 101 may also be bonded to the MEMS wafer 13 through mechanical means or through bonds produced by applying the aligned spacer layer 101 to the MEMS wafer 13 with a predetermined amount of pressure. The MEMS wafer 13 has formed thereon MEMS structures 5. In a typical MEMS wafer 13, there could hundreds to thousands of MEMS structure sites, each containing MEMS structures 5.

Figure 21:
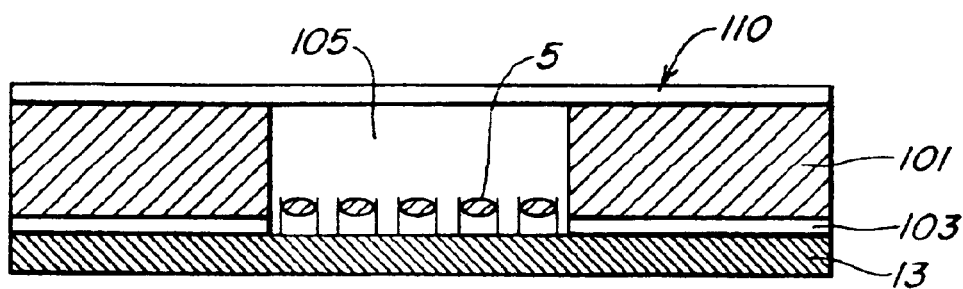
FIG. 21 is a graphic illustration of a capped MEMS wafer with spacer layer according to the concepts of the present invention.

After the aligned spacer layer 101 with adhesive layer 103 is bonded is a MEMS wafer 13 having MEMS structures 5 and openings 105 corresponding to areas of the MEMS structures 5, a wafer cap 110 is bonded to the spacer layer 101, as illustrated in FIG. 21. The wafer cap 110 may be a non-perforated cover tape. The non-perforated cover tape and/or spacer layer 101 and adhesive layer 103 comprising a plurality of layers of perforated tape may comprise static dissipative material.

The wafer cap 110 encloses the MEMS structures 5 to protect them from damage. The wafer cap 110 may include an adhesive medium. The adhesive medium of the wafer cap 110 may be an ultraviolet light releasable medium, a heat releasable medium, a combination of an ultraviolet light and heat releasable medium, a thermoplastic organic material, an ultraviolet light sensitive organic material, or a solder material. The wafer cap 110 may also be bonded to the MEMS wafer 13 through mechanical means or through bonds produced by applying the wafer cap 110 to the MEMS wafer 13 with a predetermined amount of pressure.

Also, the wafer cap 110 may be constructed from a glass-based material, a silicon-based material, a ceramic-based material, a metal, a static dissipative material, or a polymer-based material, such as, but not limited to, polyolefin, polyvinyl chloride, or polyester.

Figure 22:
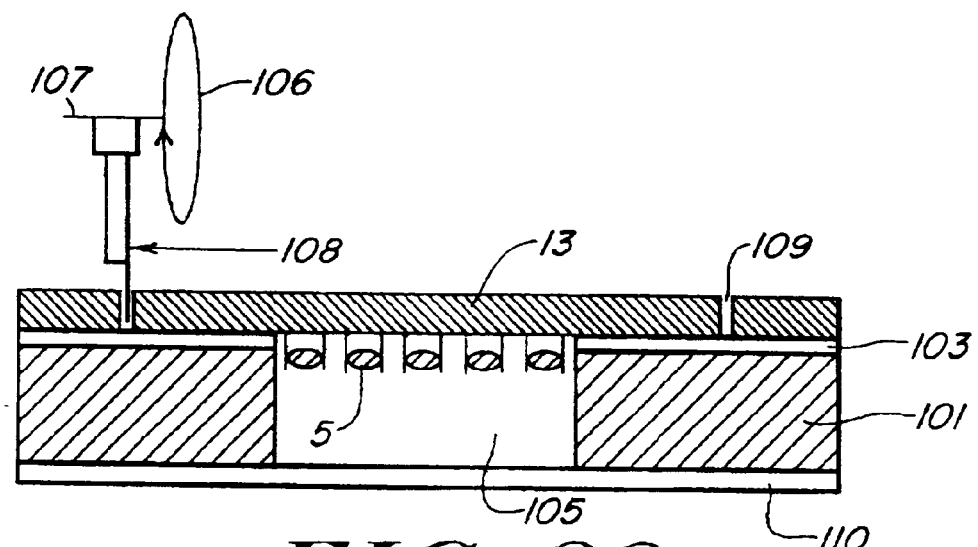
FIG. 22 is a graphic illustration of a capped MEMS wafer sawed into MEMS dies according to the concepts of the present invention.

In FIG. 22, the capped MEMS wafer 13 is diced from a backside of the MEMS wafer 13 to produce a plurality of capped MEMS dies using a dicing saw 107 with a dicing saw blade 108 rotating in a direction 106. The dicing occurs between MEMS structure sites to produce cuts or saw kerfs 109. The dicing may be realized by using a saw, using a laser, or using scribing and breaking.

Figure 23:
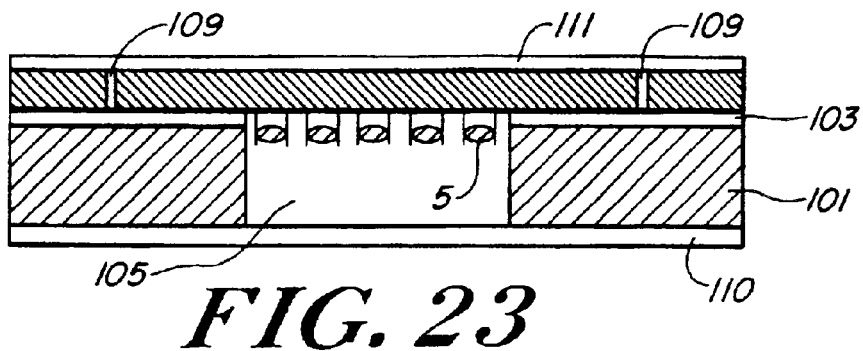
FIG. 23 is a graphic illustration of a sawn capped MEMS wafer with a layer of die placed on a backside thereof according to the concepts of the present invention.
Figure 24:
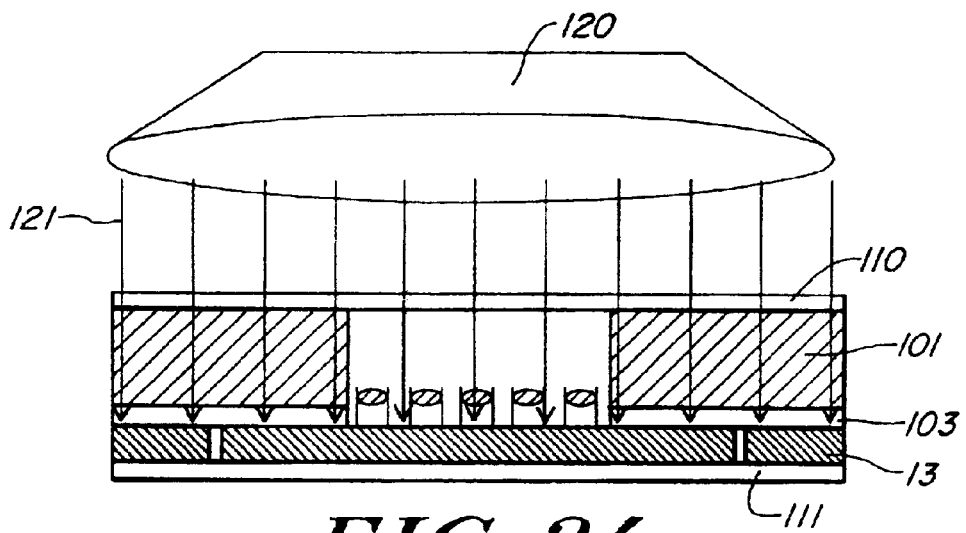
FIG. 24 is a graphic illustration of removal of a wafer cap and spacer layer from a sawn capped MEMS wafer with a layer of die placed on a backside thereof according to the concepts of the present invention.
Figure 25:
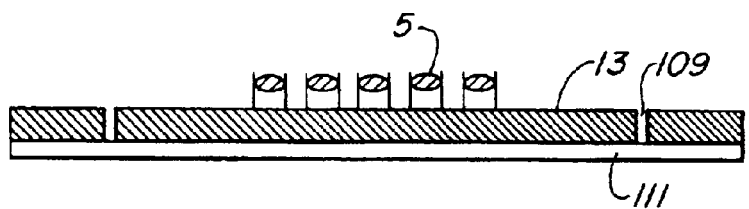
FIG. 25 is a graphic illustration of a sawn MEMS wafer with dies ready for placing in a package according to the concepts of the present invention.

In FIG. 23, a tape layer 111 is applied to the backside of the MEMS wafer 13 to facilitate mass transporting of the dies. After the application of the tape layer 111, the wafer cap 110 and spacer layer 101 with adhesive layer 103 is exposed to a radiation source 120 that produces radiation 121, as illustrated. In FIG. 24. The radiation 121 may be UV radiation, heat, or a combination of UV radiation and heat. The radiation 121 is sufficient to break the bond between the spacer layer 101 with adhesive layer 103 and the MEMS wafer 13 so that a MEMS wafer 13 with a plurality of individually removable MEMS dies without caps is produced as illustrated in FIG. 25. The wafer cap 110 and spacer layer 101 with adhesive layer 103 may be removed together as a single unit or the wafer cap 110 may be removed first, followed by spacer layer 101 with adhesive layer 103. Individual MEMS dies can then be removed from the tape layer 111 and placed in packages.

Figure 26:
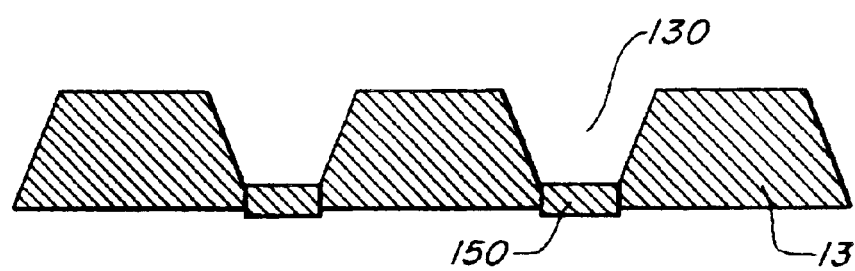
FIG. 26 is a graphical illustration of a MEMS wafer with through holes on a backside thereof according to the concepts the present invention.

FIGS. 26–33 illustrate one process of protecting a MEMS die during a separation and handling process according to the concepts of the present invention. As illustrated in FIG. 26, a MEMS wafer 13 includes a plurality of MEMS structure sites 150 with corresponding through holes 130 on a backside of the MEMS wafer 13. The through holes 130 are holes in the back of the MEMS wafer 13 that are formed by etching through the MEMS wafer 13 to the front side where the MEMS structure sites 150 are located.

Figure 27:
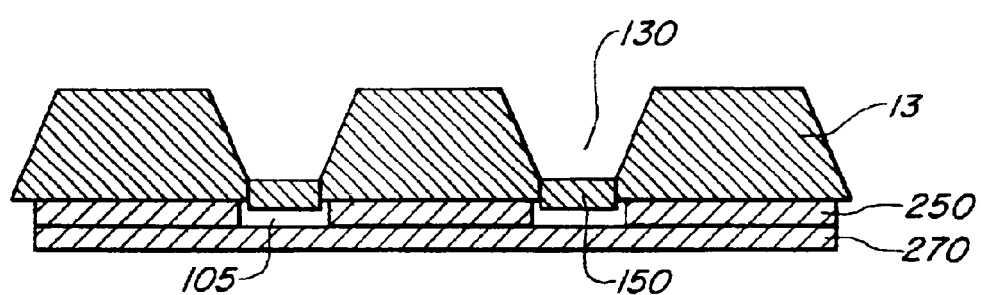
FIG. 27 is another graphical illustration of a capped MEMS wafer with through holes on a backside thereof according to the concepts the present invention.

The MEMS wafer 13 is capped in FIG. 27 with a spacer layer 250 and a wafer cap 270 on a front side of the MEMS wafer 13, a front side having the MEMS structure sites 150 located thereon. The spacer layer 250 having openings or holes 105 corresponding with each of the MEMS structure sites 150. The spacer layer 250 may include an adhesive layer.

The spacer layer 250 may comprise a tape having adhesive on two sides and a flexible film or a flexible film with an adhesive medium on one side. The flexible film may be transmissive to UV radiation and may be about 10 to 20 mils thick. The spacer layer 250 may also comprise a plurality of layers of perforated tape, an aggregate of the plurality of layers of perforated tape producing the height to prevent electrostatically induced damage to the MEMS structure sites 150 and/or to prevent the wafer cap 270 from deflecting in such a manner to come in contact with the MEMS structures 150.

The adhesive layer of the spacer layer 250 may be either an adhesive medium or a tape with adhesive on both sides. The adhesive layer of the spacer layer 250 may be an ultraviolet light releasable medium, a heat releasable medium, a combination of an ultraviolet light and heat releasable medium, a thermoplastic organic material, an ultraviolet light sensitive organic material, or a solder material.

The spacer layer 250 may be cut or punched to produce opening 105 wherein the opening corresponds to an area on a MEMS wafer 13 having a MEMS structure site 150 so as to provide clearance for surface MEMS structures. The spacer layer 250 may be cut by a laser to produce open areas corresponding to the MEMS structure sites 150 on the MEMS wafer 13 or punched to produce open areas corresponding to the MEMS structure sites 150 on the MEMS wafer 13. If a non-UV reliant adhesive material is used, the holes or openings in the spacer layer 250 may be laser cut when a UV or IR resistive material is used.

The spacer layer 250 may be bonded with the MEMS wafer 13 with the openings 105 corresponding to areas of the MEMS structure sites 150 with an adhesive medium. The spacer layer 250 may also be bonded to the MEMS wafer 13 through mechanical means or through bonds produced by applying the spacer layer 250 to the MEMS wafer 13 with a predetermined amount of pressure. The MEMS wafer 13 has formed thereon MEMS structures 150.

After the spacer layer 250 is bonded is a MEMS wafer 13 having MEMS structure sites 150 and openings 105 corresponding to the MEMS structure sites 150, a wafer cap 270 is bonded to the spacer layer 250. It is noted that the wafer cap 270 and spacer layer 250 could have been pre-bonded together and then bonded to the MEMS wafer 13. The wafer cap 270 may be a non-perforated cover tape. The non-perforated cover tape and/or spacer layer 250 comprising a plurality of layers of perforated tape may be comprised of static dissipative material.

The wafer cap 270 encloses the MEMS structure sites 150 to protect them from damage. The wafer cap 270 may include an adhesive medium. The adhesive medium of the wafer cap 270 may be an ultraviolet light releasable medium, a heat releasable medium, a combination of an ultraviolet light and heat releasable medium, a thermoplastic organic material, an ultraviolet light sensitive organic material, or a solder material. The wafer cap 270 may also be bonded to the spacer layer 250 through mechanical means or through bonds produced by applying the wafer cap 270 to the spacer layer 250 with a predetermined amount of pressure.

Also, the wafer cap 270 may be constructed from a glass-based material, a silicon-based material, a ceramic-based material, a metal, a static dissipative material, or a polymer-based material, such as, but not limited to, polyolefin, polyvinyl chloride, or polyester.

Figure 28:
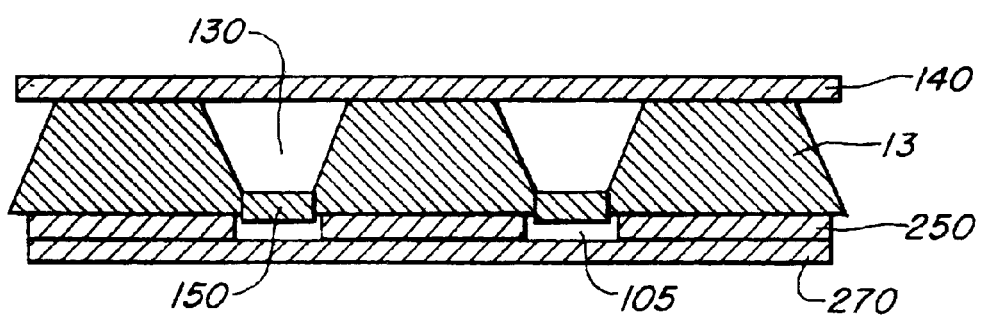
FIG. 28 is a graphic illustration of a capped MEMS wafer with through holes and a dicing tape layer on a backside thereof according to the concepts of the present invention.

FIG. 28 illustrates the application of a dicing cover tape 140 to a backside of the MEMS wafer 13 to provide protection for the through holes 130. More specifically, the dicing cover tape 140 prevents liquid and/or particulate from entering into the through holes 130 during dicing.

The dicing cover tape 140 includes an adhesive medium. The adhesive medium of the dicing cover tape 140 may be an ultraviolet light releasable medium, a heat releasable medium, a combination of an ultraviolet light and heat releasable medium, a thermoplastic organic material, an ultraviolet light sensitive organic material, or a solder material. Also, the dicing cover tape 140 may be constructed from a static dissipative material or a polymer-based material.

It is noted that the dicing cover tape 140 may also be comprised of a perforated tape and cover tape similar to the wafer cap 270 and spacer layer 250. In this embodiment, the perforated tape may comprise a tape having adhesive on two sides and a flexible film or a flexible film with an adhesive medium on one side. The flexible film may be transmissive to UV radiation and may be about 40 mils thick. The perforated tape may also comprise a plurality of layers of perforated tape, an aggregate of the plurality of layers of perforated tape producing the height to prevent electrostatically induced damage and/or to prevent the cover tape from deflecting in such a manner to cause physical damage. The adhesive layer of the perforated tape may be either an adhesive medium or a tape with adhesive on both sides. The adhesive layer of perforated tape may be an ultraviolet light releasable medium, a heat releasable medium, a combination of an ultraviolet light and heat releasable medium, a thermoplastic organic material, an ultraviolet light sensitive organic material, or a solder material. The perforated tape may be cut by a laser or punched. If a non-UV reliant adhesive material is used, the holes or openings in the perforated tape may be laser cut when a UV or IR resistive material is used. After the perforated tape is bonded is a wafer, the cover tape is bonded to the perforated tape. It is noted that the cover tape and perforated tape could have been pre-bonded together and then bonded to the wafer. The cover tape may be a non-perforated cover tape. The non-perforated cover tape and/or perforated tape or plurality of layers of perforated tape may be comprised of static dissipative material.

Figure 29:
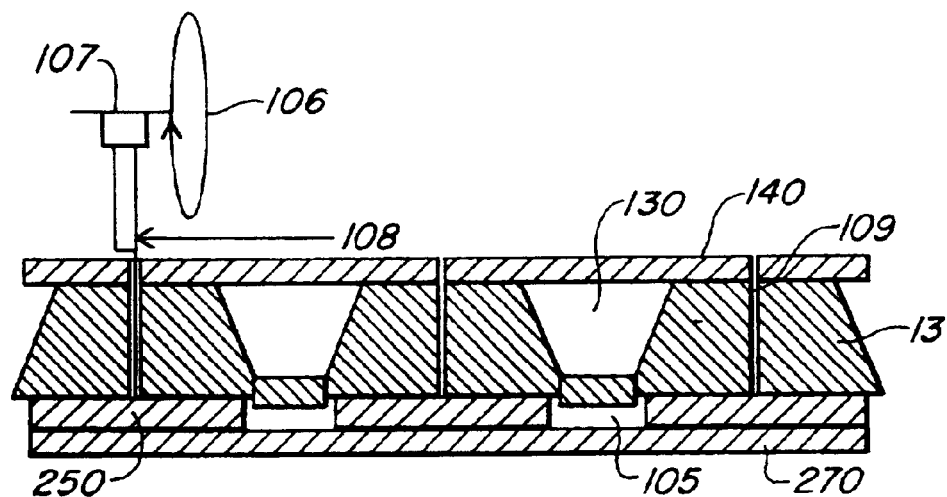
FIG. 29 is a graphic illustration of a capped MEMS wafer with through holes and a dicing tape layer on a backside thereof sawed into MEMS dies according to the concepts of the present invention.

In FIG. 29, the capped MEMS wafer 13 is diced from a backside of the MEMS wafer 13 to produce a plurality of capped MEMS dies using a dicing saw 107 with a dicing saw blade 108 rotating in a direction 106. The dicing occurs through the dicing cover tape 140 and MEMS wafer 13 and between MEMS structure sites 150 to produce cuts or saw kerfs 109. The dicing may be realized by using a saw, using a laser, or using scribing and breaking.

Figure 30:
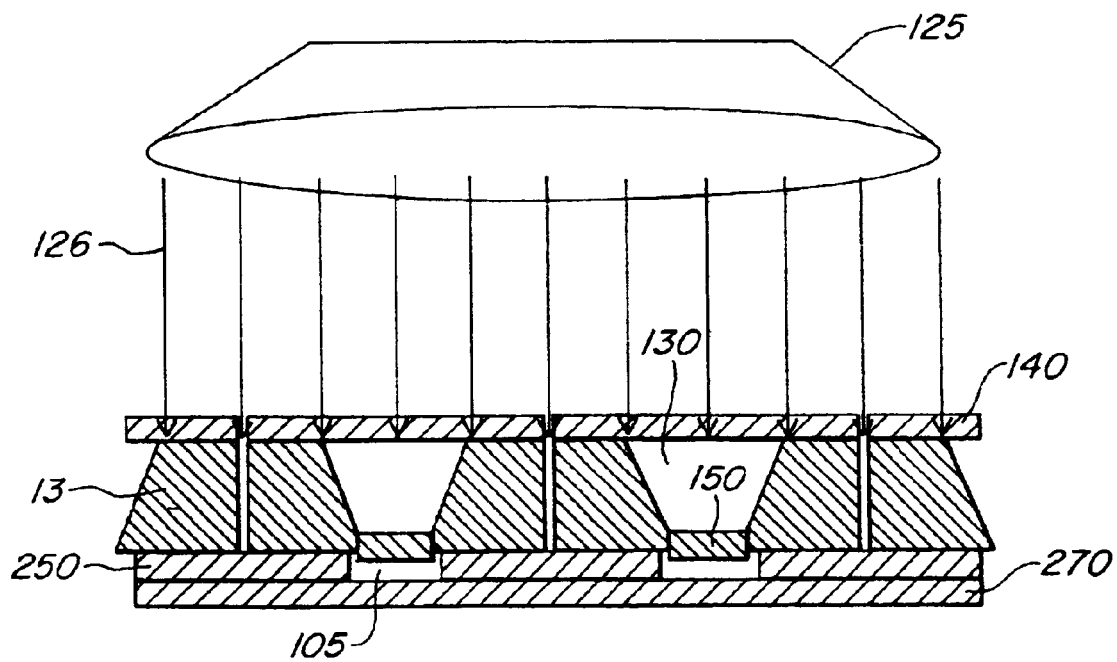
FIG. 30 is a graphic illustration of exposing the dicing tape with UV radiation according to the concepts of the present invention.
Figure 31:
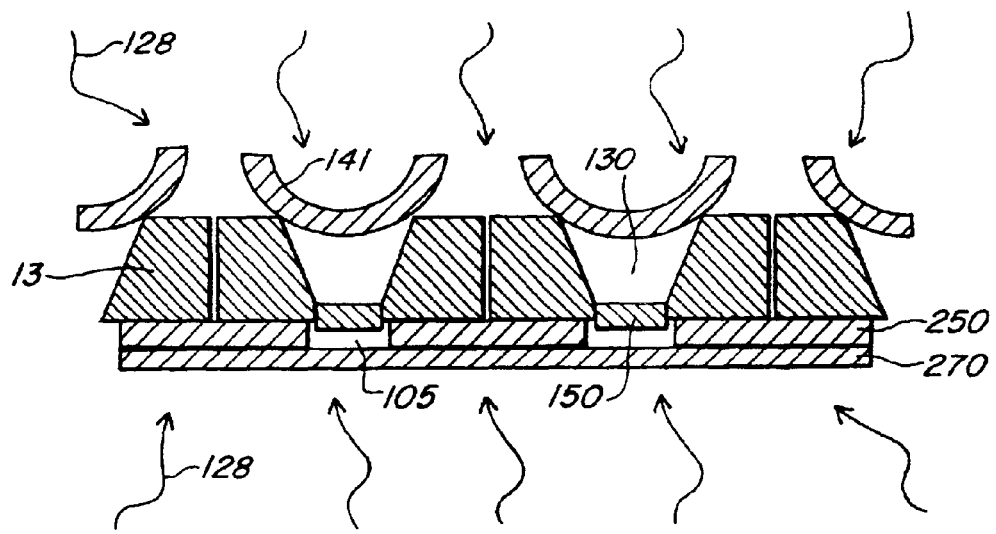
FIG. 31 is a graphic illustration of exposing the dicing tape with heat according to the concepts of the present invention.
Figure 32:
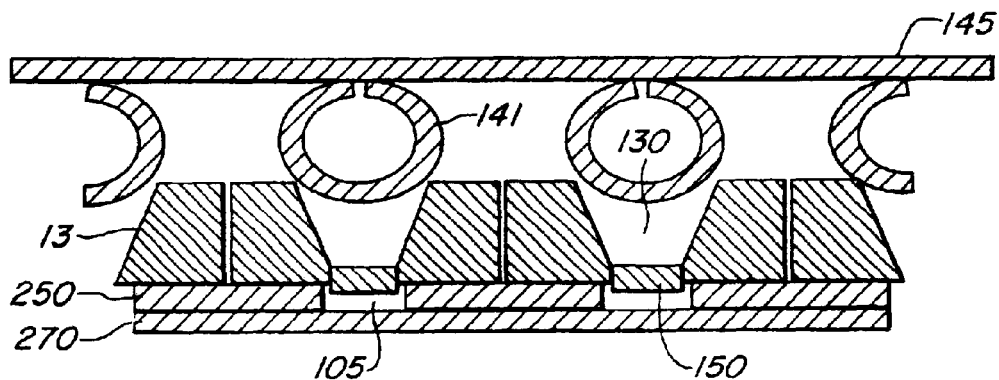
FIG. 32 is a graphic illustration of removing the dicing tape from a sawn capped MEMS wafer with through holes on a backside thereof according to the concepts of the present invention.

In FIG. 30, the cut dicing cover tape 140 is exposed to an UV radiation source 125 that produces UV radiation 126. The UV radiation 126 is sufficient to break the bond or release the adhesive between dicing cover tape 140 and the MEMS wafer 13. The cut dicing cover tape 141 is then heated, via conduction, convection, or by radiation 128 to produce individual releasable cut dicing cover tape pieces 141, as shown in FIG. 31. The application of heat 128 causes the cut dicing cover tape pieces 141 to curl up and away from the MEMS wafer 13 in this embodiment. The cut dicing cover tape pieces 141 are removed together, as illustrated in FIG. 32, with a dicing cover tape removal layer 145. It is noted that the dicing cover tape 140 may be a non-heat shrinkable and/or non-UV releasable tape so that the dicing cover tape 140 could be individually removed without use of UV radiation or heat.

Figure 33:
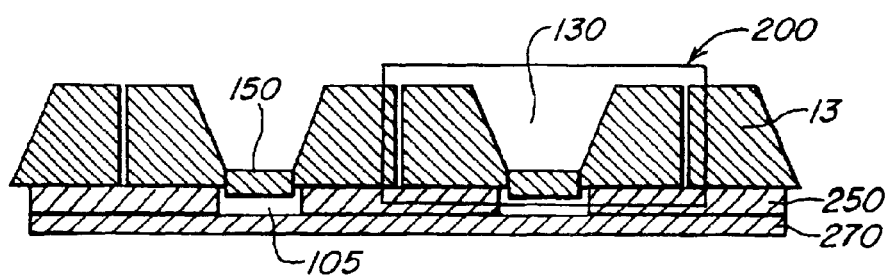
FIG. 33 is a graphic illustration of a sawn MEMS wafer with through holes on a backside thereof with dies ready for placing in a package according to the concepts of the present invention.

FIG. 33 shows dies 200 ready for removal from the spacer layer 250 and wafer cap 270, which can be accomplished a number of ways. Also possible, but not shown in the figures, is the sawing of individually capped dies, accomplished by simultaneously sawing through the backside cover tape 140 and the spacer 250 and wafer cap 270. This would be accomplished via the addition of a transfer tape layer to the wafer cap 270 prior to sawing, and subsequent removal of the die 13, spacer 250, and wafer cap 270 from the transfer tape layer. The wafer cap 270 and spacer layer 250 may be removed from an individual die before the die is placed in a package or after it is placed in a package.

Figure 34:
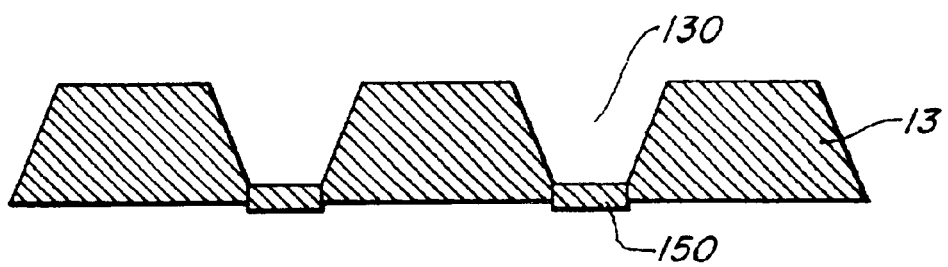
FIG. 34 is a graphical illustration of a MEMS wafer with through holes on a backside thereof according to the concepts of another embodiment of the present invention.

FIGS. 34–41 illustrate another, preferred, process of protecting a MEMS die during a separation and handling process according to the concepts of the present invention. As illustrated in FIG. 34, a wafer 13 includes a plurality of MEMS structure sites 150 with corresponding through holes 130 on a backside of the wafer 13. The through holes 130 are holes in the back of the wafer 13 that are formed by etching through the wafer 13 to the front side where the MEMS structure sites 150 are located.

Figure 35:
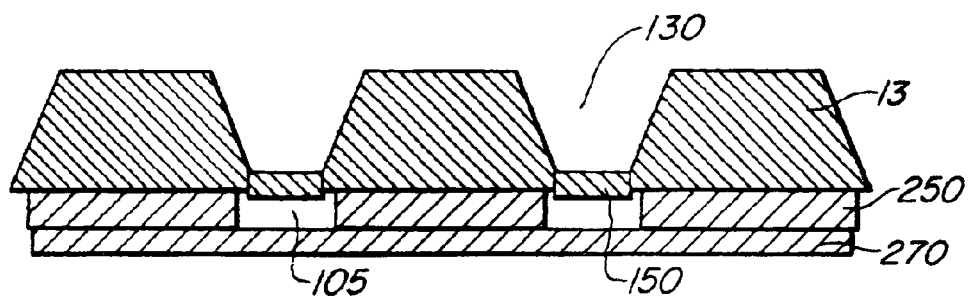
FIG. 35 is another graphical illustration of a capped MEMS wafer with through holes on a backside thereof according to the concepts of another embodiment of the present invention.

The wafer 13 is capped in FIG. 35 with a spacer layer 250 and a wafer cap 270 on a front side or patterned side of the wafer 13, a front side having the MEMS structure sites 150 located thereon. The spacer layer 250 having openings or holes 105 corresponding with each of the MEMS structure sites 150. The spacer layer 250 may include an adhesive layer.

The spacer layer 250 may comprise a tape having adhesive on two sides and a flexible film or a flexible film with an adhesive medium on one side. The flexible film may be transmissive to UV radiation and may be about 10 to 20 mils thick. The spacer layer 250 may also comprise a plurality of layers of perforated tape, an aggregate of the plurality of layers of perforated tape producing a height to prevent electrostatically induced damage to the MEMS structure sites 150 and/or to prevent the wafer cap 270 from deflecting in such a manner to come in contact with the MEMS structures 150.

The adhesive layer of the spacer layer 250 may be either an adhesive medium or a tape with adhesive on both sides. The adhesive layer of the spacer layer 250 may be an ultraviolet light releasable medium, a heat releasable medium, a combination of an ultraviolet light and heat releasable medium, a thermoplastic organic material, an ultraviolet light sensitive organic material, or a solder material.

The spacer layer 250 may be cut or punched to produce opening 105 wherein the opening corresponds to an area on a wafer 13 having a MEMS structure site 150 so as to provide clearance for surface MEMS structures. The spacer layer 250 may be cut by a laser to produce open areas corresponding to the MEMS structure sites 150 on the wafer 13 or punched to produce open areas corresponding to the MEMS structure sites 150 on the wafer 13. If a non UV reliant adhesive material is used, the holes or openings in the spacer layer 250 may be laser cut when a UV or IR resistive material is used.

The spacer layer 250 may be bonded with the wafer 13 with the openings 105 corresponding to areas of the MEMS structure sites 150 with an adhesive medium. The spacer layer 250 may also be bonded to the wafer 13 through mechanical means or through bonds produced by applying the spacer layer 250 to the wafer 13 with a predetermined amount of pressure. The wafer 13 has formed thereon MEMS structures 150.

After the spacer layer 250 is bonded to a wafer 13 having MEMS structure sites 150 and openings 105 corresponding to the MEMS structure sites 150, a wafer cap 270 is bonded to the spacer layer 250. It is noted that the wafer cap 270 and spacer layer, 250 could have been pre-bonded together and then bonded to the wafer 13. The wafer cap 270 may be a non-perforated cover tape. The non-perforated cover tape and/or spacer layer 250 comprising a plurality of layers of perforated tape may comprise static dissipative material.

The wafer cap 270 encloses the MEMS structure sites 150 to protect them from damage. The wafer cap 270 may include an adhesive medium. The adhesive medium of the wafer cap 270 may be an ultraviolet light releasable medium, a heat releasable medium, a combination of an ultraviolet light and heat releasable medium, a thermoplastic organic material, an ultraviolet light sensitive organic material, or a solder material. The wafer cap 270 may also be bonded to the spacer layer 250 through mechanical means or through bonds produced by applying the wafer cap 270 to the spacer layer 250 with a predetermined amount of pressure.

Also, the wafer cap 270 may be constructed from a glass-based material, a silicon-based material, a ceramic-based material, a metal, a static dissipative material, or a polymer-based material, such as, but not limited to, polyolefin, polyvinyl chloride, or polyester.

Figure 36:
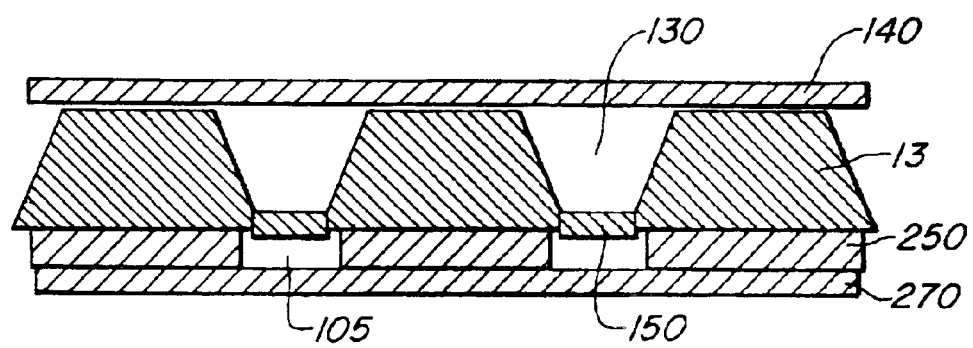
FIG. 36 is a graphic illustration of a capped MEMS wafer with through holes and a dicing tape layer on a backside thereof according to the concepts of another embodiment of the present invention.

FIG. 36 illustrates the application of a dicing cover tape 140 to a backside of the MEMS wafer 13 to provide protection for the through holes 130. More specifically, the dicing cover tape 140 prevents liquid and/or particulate from entering into the through holes 130 during dicing.

The dicing cover tape 140 includes an adhesive medium. The adhesive medium of the dicing cover tape 140 may be an ultraviolet light releasable medium, a heat releasable medium, a combination of an ultraviolet light and heat releasable medium, a thermoplastic organic material, an ultraviolet light sensitive organic material, or a solder material. Also, the dicing cover tape 140 may be constructed from a static dissipative material or a polymer-based material.

It is noted that the dicing cover tape 140 may also be comprised of a perforated tape and cover tape similar to the wafer cap 270 and spacer layer 250. In this embodiment, the perforated tape may comprise a tape having adhesive on two sides and a flexible film or a flexible film with an adhesive medium on one side. The flexible film may be transmissive to UV radiation and may be about 40 mils thick. The perforated tape may also comprise a plurality of layers of perforated tape, an aggregate of the plurality of layers of perforated tape producing the height to prevent electrostatically induced damage and/or to prevent the cover tape from deflecting in such a manner to cause physical damage. The adhesive layer of the perforated tape may be either an adhesive medium or a tape with adhesive on both sides. The adhesive layer of perforated tape may be an ultraviolet light releasable medium, a heat releasable medium, a combination of an ultraviolet light and heat releasable medium, a thermoplastic organic material, an ultraviolet light sensitive organic material, or a solder material. The perforated tape may be cut by a laser or punched. If a non-UV reliant adhesive material is used, the holes or openings in the perforated tape may be laser cut when a UV or IR resistive material is used. After the perforated tape is bonded is a wafer, the cover tape is bonded to the perforated tape. It is noted that the cover tape and perforated tape could have been pre-bonded together and then bonded to the wafer. The cover tape may be a non-perforated cover tape. The non-perforated cover tape and/or perforated tape or plurality of layers of perforated tape may comprise static dissipative material.

Figure 37:
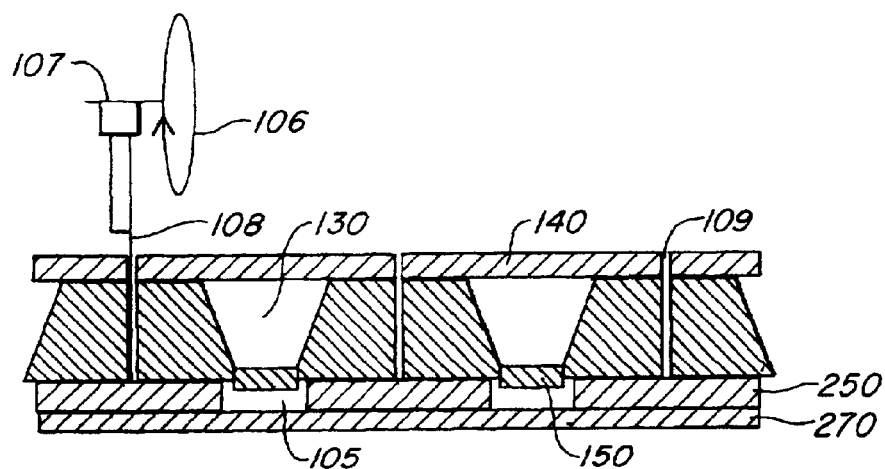
FIG. 37 is a graphic illustration of a capped MEMS wafer with through holes and a dicing tape layer on a backside thereof sawed into MEMS dies according to the concepts of another embodiment of the present invention.

In FIG. 37, the capped wafer 13 is diced from a backside of the wafer 13 to produce a plurality of capped MEMS dies using a dicing saw 107 with a dicing saw blade 108 rotating in a direction 106. The dicing occurs through the dicing cover tape 140 and wafer 13 and between MEMS structure sites 150 to produce cuts or saw kerfs 109. The dicing may be realized by using a saw, using a laser, or using scribing and breaking.

Figure 38:
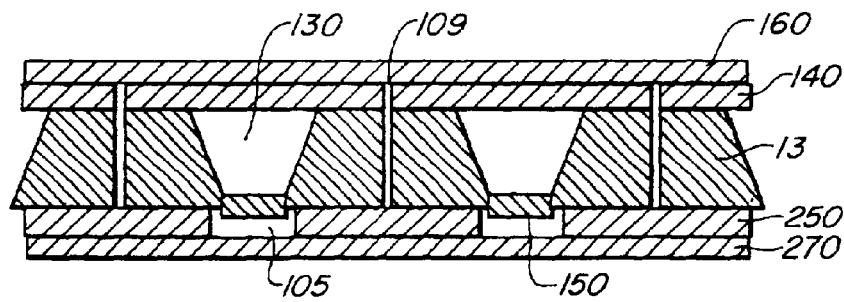
FIG. 38 is a graphic illustration of a sawn capped MEMS wafer with through holes and a dicing tape layer and transfer tape on a backside thereof according to the concepts of another embodiment of the present invention.

In FIG. 38, a second layer of tape 160; preferably, a standard, non-UV curable adhesive tape; is added to the backside of the diced wafer 13. The second tape, or transfer tape 160 is applied over the diced the dicing cover tape 140. This transfer tape 160 is use in transferring the diced wafer 13, as a whole unit, to another station or stations in the process, such as a station performing die inspection.

Figure 39:
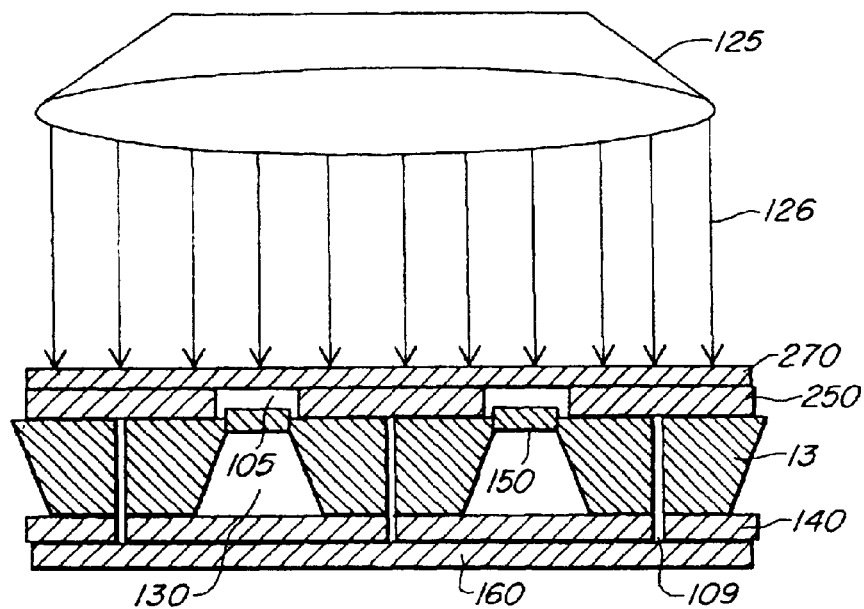
FIG. 39 is a graphic illustration of exposing the perforated layer tape and cover tape with UV radiation according to the concepts of another embodiment of the present invention.

In FIG. 39, the wafer cap 270 and spacer layer 250 are exposed to UV radiation 126 from a UV source 125. This exposure by UV radiation 126 enables the wafer cap 270 and spacer layer 250 to be peeled away from the wafer 13 as individual pieces or layers if each layer used a UV releasable adhesive or as a single unit if only the spacer layer 250 used a UV releasable adhesive for bonding to the wafer 13. By removing the wafer cap 270 and spacer layer 250, the MEMS structure sites 150 become exposed, ready for inspection, testing, or actual use.

Figure 40:
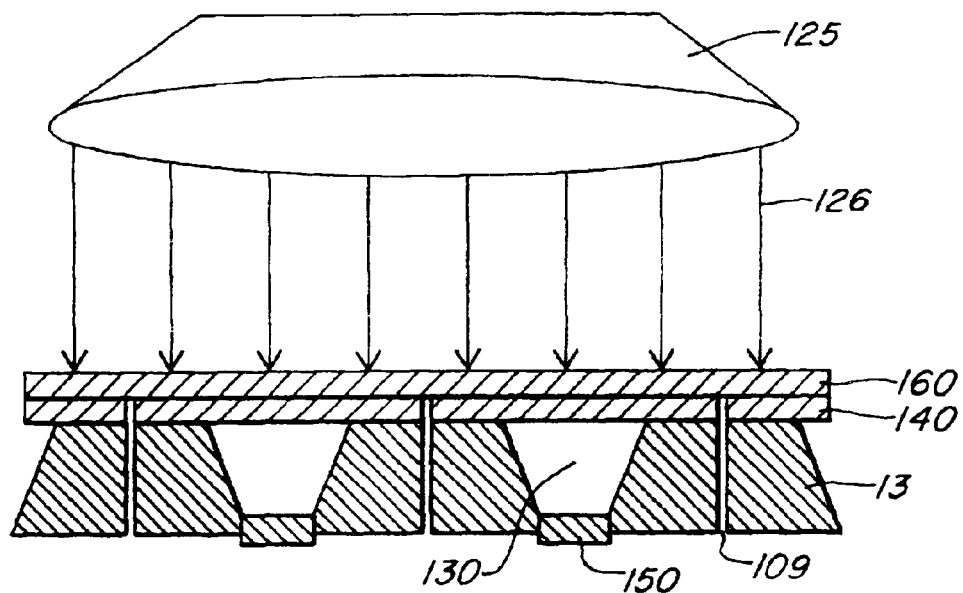
FIG. 40 is a graphic illustration of exposing the dicing tape with UV radiation after removal of the perforated tape layer and cover tape according to the concepts of another embodiment of the present invention.

In FIG. 40, the cut dicing cover tape 140 and transfer tape 160 are exposed to an UV radiation source 125 that produces UV radiation 126. In the preferred embodiment, the UV radiation 126 is sufficient to break the bond or release the adhesive between dicing cover tape 140 and the wafer 13 because in the preferred embodiment, the transfer tape 160 uses a non-UV releasable adhesive to bond to the dicing cover tape 140.

Figure 41:
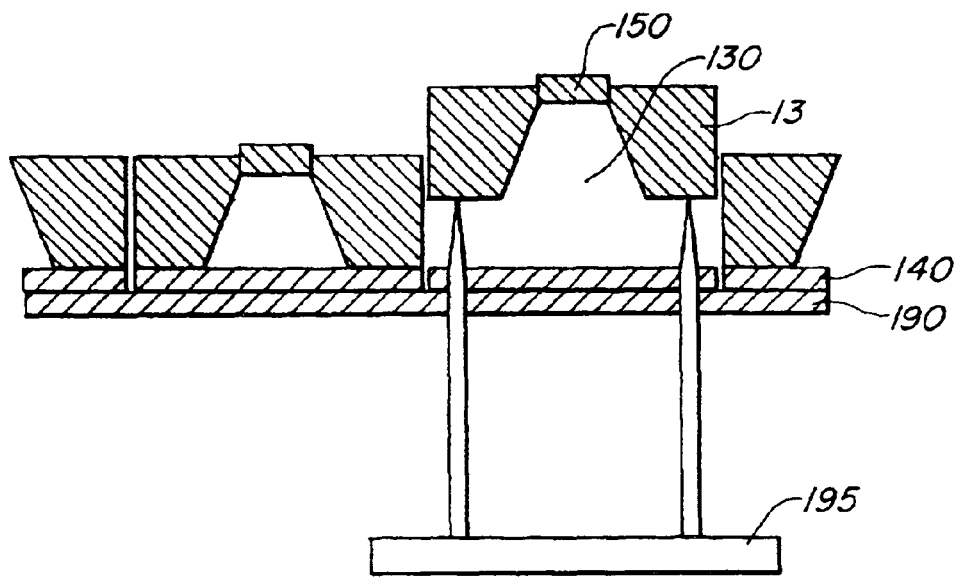
FIG. 41 is a graphic illustration of removing the die from a wafer having UV exposed dicing tape and transfer tape on a backside of the wafer according to the concepts of another embodiment of the present invention.

As shown in FIG. 41, individual dies from the cut wafer 13 are lifted off the dicing cover tape 140 and transfer tape 190 with die sorting equipment. In a preferred embodiment, a standard die ejection needle assembly 195 is used to lift off the individual dies of the wafer 13 from the dicing cover tape 140 and transfer tape 190.

Figure 42:
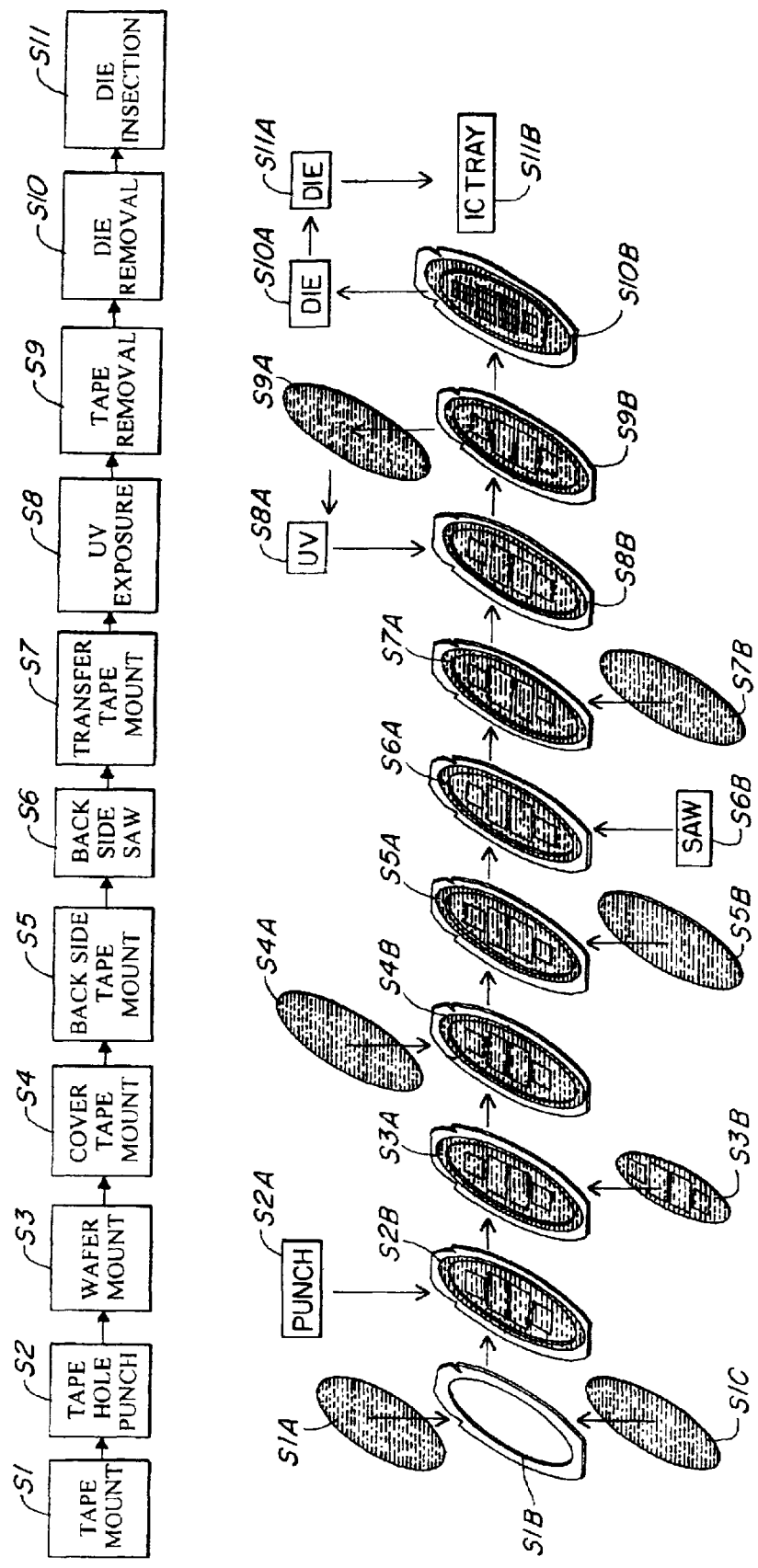
FIG. 42 shows a graphic illustration of a process for protecting, dicing, removing, and packaging a wafer with through holes on a backside thereof according to the concepts of a further embodiment of the present invention.

FIG. 42 illustrates a preferred process for protecting a wafer during dicing. As shown in FIG. 42, at step S1, layers of tape S1A and S1C are mounted or bonded to a carrier ring S1B. These layers of tape S1A and S1C produce an aggregate of layers of tape to produce a height so as to prevent electrostatically induced damage to the MEMS structures on the wafer S3B and/or to prevent a wafer cap S4A from deflecting in such a manner to come in contact with the MEMS structures on the wafer S3B.

In step S2, the layers of tape S1A and S1C are punched S2A and S1C are so as to produce recesses within the layered tape corresponding to the MEMS structure sites S2B. It is noted that the adhesive of the layers of tape S1A and S1C may be an ultraviolet light releasable medium, a heat releasable medium, a combination of an ultraviolet light and heat releasable medium, a thermoplastic organic material, an ultraviolet light sensitive organic material, or a solder material.

The layers of tape S1A and S1C may be cut by a laser to produce open areas corresponding to the MEMS structure sites on the wafer or punched to produce open areas corresponding to the MEMS structure sites on the wafer. If a non-UV reliant adhesive material is used, the holes or openings in the layers of tape S1A and S1C may be laser cut when a UV or IR resistive material is used.

In step S3, a wafer S3B is mounted to the carrier ring with the layers of tape S3A. Thereafter, a cover tape S4A is mounted, at step S4, over the layers of tape and wafer S4B, and a dicing tape S5B is mounted on the other side of the layers of tape and wafer S5A, at step S5. The wafer S6A is diced on a backside by a saw S6B in step S6. Not only is the wafer diced, but the dicing tape is also cut.

At step S7, a transfer tape S7B is applied over the dicing tape of the wafer combination S7A. The layers of tape and cover tape of wafer combination S8B are exposed by UV radiation S8A at step S8. At step S9, the exposed layers of tape and cover tape S9A are removed from the wafer combination S9B and thereafter the transfer tape and dicing tape are exposed to UV radiation to break the bond between the dicing tape and the wafer.

At step S10, individual dies S10A are removed from the wafer S10B by die sorting equipment. In a preferred embodiment, a standard die ejection needle assembly is used to lift off the individual dies S10A of the wafer S10B from the dicing cover tape and transfer tape. Finally, at step S11, the die S11A is inspected and placed into an integrated Circuit ("IC") tray S11B.

In summary, the present invention prepares a MEMS wafer having a plurality of MEMS structure sites thereon; mounts, upon the MEMS wafer, a wafer cap to produce a laminated MEMS wafer, the wafer cap being recessed in areas corresponding to locations of the MEMS structure sites on the MEMS wafer; and dices the laminated MEMS wafer into a plurality of MEMS dies. It is further contemplated that a contiguous backside tape is applied on a backside of the MEMS wafer, the backside of the MEMS wafer being a side opposite of a side having the MEMS structure sites located thereon. This contiguous backside tape can be applied to a backside of the MEMS wafer after the wafer cap is mounted on the MEMS wafer; before the wafer cap is mounted on the MEMS wafer; or before the laminated MEMS wafer is sawn.

Furthermore, a MEMS wafer is fabricated having a plurality of MEMS structure sites thereon and a wafer cap is fabricated a wafer cap thereon. The wafer cap is bonded to the MEMS wafer to produce a laminated MEMS wafer, the wafer cap being recessed in areas corresponding to locations of the MEMS structure sites on the MEMS wafer. Individual dies may be removed from the diced laminated MEMS wafer before the wafer cap is removed from the laminated MEMS wafer. These dies may be mounted into a package before the wafer cap is removed from the laminated MEMS wafer or after the wafer cap is removed from the laminated MEMS wafer. Moreover, the individual dies may be removed from the diced laminated MEMS wafer before the wafer cap is removed from the laminated MEMS wafer and mounted into a package before the wafer cap is removed from the laminated MEMS wafer.

One embodiment of the present invention protects a MEMS structure during a dicing of a MEMS wafer to produce individual MEMS dies by preparing a MEMS wafer having a plurality of MEMS structure sites thereon; mounting, upon the MEMS wafer, a wafer cap to produce a laminated MEMS wafer, the wafer cap being recessed in areas corresponding to locations of the MEMS structure sites on the MEMS wafer; and dicing the laminated MEMS wafer into a plurality of MEMS dies. The laminated MEMS wafer may be diced using a saw, a laser, or scribing and breaking. The wafer cap may include an adhesive medium, or the wafer cap may be a cover tape with an adhesive medium.

The adhesive medium may be an ultraviolet light releasable medium, a heat releasable medium, a combination of an ultraviolet light and heat releasable medium, a thermoplastic organic material, an ultraviolet light sensitive organic material, or a solder material. The wafer cap may be attached to the MEMS wafer through mechanical means or bonds produced by applying the wafer cap to the MEMS wafer with a predetermined amount of pressure.

The wafer cap may comprise silicon-based material, an organic adhesive medium, a glass-based material, a ceramic-based material, a polymer-based material, a metal, or a static dissipative material.

A contiguous tape may be applied to a backside of the MEMS wafer, the backside of the MEMS wafer being a side opposite of a side having the MEMS structure sites located thereon. The contiguous tape may be applied to a backside of the MEMS wafer after the wafer cap is mounted on the MEMS wafer, applied to a backside of the MEMS wafer before the wafer cap is mounted on the MEMS wafer, or applied to a backside of the MEMS wafer before the laminated MEMS wafer is sawn.

Another embodiment of the present invention protects a MEMS structure during a production of individual MEMS dies by fabricating a MEMS wafer having a plurality of MEMS structure sites thereon; fabricating a wafer cap; bonding the wafer cap to the MEMS wafer to produce a laminated MEMS wafer, the wafer cap being recessed in areas corresponding to locations of the MEMS structure sites on the MEMS wafer; dicing the laminated MEMS wafer into a plurality of MEMS dies; and removing the wafer cap from the laminated MEMS wafer.

The individual dies may be removed from the diced laminated MEMS wafer before or after the wafer cap is removed from the laminated MEMS wafer, or the individual dies may be mounted into a package before or after the wafer cap is removed from the laminated MEMS wafer.

The wafer cap may include an adhesive medium, or the wafer cap may be a cover tape with an adhesive medium. The adhesive medium may be an ultraviolet light releasable medium, a heat releasable medium, a combination of an ultraviolet light and heat releasable medium, a thermoplastic organic material, an ultraviolet light sensitive organic material, or a solder material. The wafer cap may be attached to the MEMS wafer through mechanical means or bonds produced by applying the wafer cap to the MEMS wafer with a predetermined amount of pressure.

The wafer cap may comprise silicon-based material, an organic adhesive medium, a glass-based material, a ceramic-based material, a polymer-based material, a metal, or a static dissipative material.

A contiguous tape may be applied to a backside of the MEMS wafer, the backside of the MEMS wafer being a side opposite of a side having the MEMS structure sites located thereon. The contiguous tape may be applied to a backside of the MEMS wafer after the wafer cap is mounted on the MEMS wafer, applied to a backside of the MEMS wafer before the wafer cap is mounted on the MEMS wafer, or applied to a backside of the MEMS wafer before the laminated MEMS wafer is sawn.

A further embodiment of the present invention is a laminated MEMS wafer having a MEMS wafer having a plurality of MEMS structure sites located thereon and a removable wafer cap. The removable wafer cap is bonded to the MEMS wafer to produce a laminated MEMS wafer and recessed in areas corresponding to locations of the MEMS structure sites on the MEMS wafer.

The wafer cap may include an adhesive medium. The adhesive medium may be an ultraviolet light releasable medium, a heat releasable medium, a combination of an ultraviolet light and heat releasable medium, a thermoplastic organic material, an ultraviolet light sensitive organic material, or a solder material. The wafer cap may be attached to the MEMS wafer through mechanical means or bonds produced by applying the wafer cap to the MEMS wafer with a predetermined amount of pressure.

The wafer cap may comprise silicon-based material, an organic adhesive medium, a glass-based material, a ceramic-based material, a polymer-based material, a metal, or a static dissipative material.

A contiguous tape may be applied to a backside of the MEMS wafer, the backside of the MEMS wafer being a side opposite of a side having the MEMS structure sites located thereon.

A fourth embodiment of the present invention protects a MEMS structure during a dicing of a MEMS wafer to produce individual MEMS dies by preparing a MEMS wafer having a plurality of MEMS structure sites thereon; mounting, upon the MEMS wafer, punched tape, the punched tape having holes in areas corresponding to locations of the MEMS structure sites on the MEMS wafer; mounting, upon the punched tape, a cover tape to produce a laminated MEMS wafer, the cover tape being without openings; and dicing the laminated MEMS wafer into a plurality of MEMS dies.

The cover tape may include an adhesive medium. The adhesive medium may be an ultraviolet light releasable medium, a heat releasable medium, a combination of an ultraviolet light and heat releasable medium, a thermoplastic organic material, or an ultraviolet light sensitive organic material.

A contiguous tape may be applied to a backside of the MEMS wafer, the backside of the MEMS wafer being a side opposite of a side having the MEMS structure sites located thereon.

The cover tape, punched tape, and the contiguous tape may comprise a static dissipative material.

A fifth embodiment of the present invention makes a protected MEMS structure by preparing a MEMS wafer having a plurality of MEMS structure sites thereon; mounting, upon the MEMS wafer, a spacer layer, the spacer layer being perforated in areas corresponding to locations of the MEMS structure sites on the MEMS wafer; and mounting, upon the spacer layer, a wafer cap to produce a laminated MEMS wafer, the spacer layer having a height to prevent electrostatically induced damage to the MEMS wafer.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape; an aggregate of the plurality of layers of perforated tape producing the height to prevent electrostatically induced damage to the MEMS wafer.

The wafer cap may be a cover tape wherein the cover tape may comprise a static dissipative material.

The height of the spacer layer may prevent the wafer cap from deflecting in such a manner to come in contact with the MEMS structures.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A sixth embodiment of the present invention makes a protected MEMS structure by preparing a MEMS wafer having a plurality of MEMS structure sites thereon; mounting, upon the MEMS wafer, a spacer layer, the spacer layer being perforated in areas corresponding to locations of the MEMS structure sites on the MEMS wafer; and mounting, upon the spacer layer, a wafer cap to produce a laminated MEMS wafer, the spacer layer having a height to prevent damage to the MEMS structures due to the wafer cap coming into physical contact with the MEMS wafer.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape, an aggregate of the plurality of layers of perforated tape producing the height to prevent the wafer cap from coming into physical contact with the MEMS wafer.

The wafer cap may be a cover tape wherein the cover tape may comprise a static dissipative material.

The height of the spacer layer may prevent the wafer cap from deflecting in such a manner to come in contact with the MEMS structures.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A seventh embodiment of the present invention makes a protected MEMS structure by preparing a MEMS wafer having a plurality of MEMS structure sites thereon; mounting, upon the MEMS wafer, a spacer layer, the spacer layer being perforated in areas corresponding to locations of the MEMS structure sites on the MEMS wafer; and mounting, upon the spacer layer, a wafer cap to produce a laminated MEMS wafer, the spacer layer having a height to prevent electrostatically induced damage to the MEMS wafer and to prevent damage to the MEMS structures due to the wafer cap coming into physical contact with the MEMS wafer.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape, an aggregate of the plurality of layers of perforated tape producing the height to prevent electrostatically induced damage to the MEMS wafer and to prevent damage to the MEMS structures due to the wafer cap coming into physical contact with the MEMS wafer.

The wafer cap may be a cover tape wherein the cover tape may comprise a static dissipative material.

The height of the spacer layer may prevent the wafer cap from deflecting in such a manner to come in contact with the MEMS structures.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A laminated MEMS wafer, according to one embodiment of the present invention, includes a MEMS wafer having a plurality of MEMS structure sites located thereon; a spacer layer mounted upon the MEMS wafer, the spacer layer being perforated in areas corresponding to locations of the MEMS structure sites on the MEMS wafer; and a wafer cap mounted upon the spacer layer to produce a laminated MEMS wafer. The spacer layer has a height to prevent electrostatically induced damage to the MEMS wafer.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape; an aggregate of the plurality of layers of perforated tape producing the height to prevent electrostatically induced damage to the MEMS wafer.

The wafer cap may be a cover tape wherein the cover tape may comprise a static dissipative material.

The height of the spacer layer may prevent the wafer cap from deflecting in such a manner to come in contact with the MEMS structures.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A laminated MEMS wafer, according another embodiment of the present invention, includes a MEMS wafer having a plurality of MEMS structure sites located thereon; a spacer layer mounted upon the MEMS wafer, the spacer layer being perforated in areas corresponding to locations of the MEMS structure sites on the MEMS wafer; and a wafer cap mounted upon the spacer layer to produce a laminated MEMS wafer. The spacer layer has a height to prevent damage to the MEMS structures due to the wafer cap coming into physical contact with the MEMS wafer.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape, an aggregate of the plurality of layers of perforated tape producing the height to prevent damage to the MEMS structures due to the wafer cap coming into physical contact with the MEMS wafer.

The wafer cap may be a cover tape wherein the cover tape may comprise a static dissipative material.

The height of the spacer layer may prevent the wafer cap from deflecting in such a manner to come in contact with the MEMS structures.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A laminated MEMS wafer, according to a further embodiment of the present invention, includes a MEMS wafer having a plurality of MEMS structure sites located thereon; a spacer layer mounted upon the MEMS wafer, the spacer layer being perforated in areas corresponding to locations of the MEMS structure sites on the MEMS wafer; and a wafer cap mounted upon the spacer layer to produce a laminated MEMS wafer. The spacer layer having a height to prevent damage to the MEMS structures due to the wafer cap coming into physical contact with the MEMS wafer and to prevent electrostatically induced damage to the MEMS wafer.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape, an aggregate of the plurality of layers of perforated tape producing the height to prevent electrostatically induced damage to the MEMS wafer and to prevent damage to the MEMS structures due to the wafer cap coming into physical contact with the MEMS wafer.

The wafer cap may be a cover tape wherein the cover tape may comprise a static dissipative material.

The height of the spacer layer may prevent the wafer cap from deflecting in such a manner to come in contact with the MEMS structures.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

An eighth embodiment of the present invention protects a MEMS structure during a dicing of a MEMS wafer to produce individual MEMS dies by preparing a MEMS wafer having a plurality of MEMS structure sites on a first side and a plurality of through holes on a second side; mounting, upon the first side of the MEMS wafer, a wafer cap to produce a laminated MEMS wafer, the wafer cap being recessed in areas corresponding to locations of the MEMS structure sites on the MEMS wafer; mounting, upon the second side of the MEMS wafer, a layer of dicing tape; and dicing the laminated MEMS wafer into a plurality of MEMS dies.

The layer of dicing tape may have a UV releasable adhesive, be heat shrinkable, or have a UV releasable adhesive and be heat shrinkable.

The wafer cap may include an adhesive medium, or the wafer cap may be a cover tape with an adhesive medium. The adhesive medium may be an ultraviolet light releasable medium, a heat releasable medium, a combination of an ultraviolet light and heat releasable medium, a thermoplastic organic material, an ultraviolet light sensitive organic material, or a solder material. The wafer cap may be attached to the MEMS wafer through mechanical means or bonds produced by applying the wafer cap to the MEMS wafer with a predetermined amount of pressure.

The wafer cap may comprise silicon-based material, an organic adhesive medium, a glass-based material, a ceramic-based material, a polymer-based material, a metal, or a static dissipative material.

A contiguous tape may be applied to a backside of the MEMS wafer, the backside of the MEMS wafer being a side opposite of a side having the MEMS structure sites located thereon. The contiguous tape may be applied to a backside of the MEMS wafer after the wafer cap is mounted on the MEMS wafer, applied to a backside of the MEMS wafer before the wafer cap is mounted on the MEMS wafer, or applied to a backside of the MEMS wafer before the laminated MEMS wafer is sawn.

The layer of dicing tape may be applied to a second side of the MEMS wafer before or after the wafer cap is mounted on the MEMS wafer. The layer of dicing tape may be applied to a second side of the MEMS wafer before or after the laminated MEMS wafer is sawn.

The wafer cap may be a spacer layer and a wafer cover.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape, an aggregate of the plurality of layers of perforated tape producing the height to prevent electrostatically induced damage to the MEMS wafer and/or to prevent damage to the MEMS structures due to the wafer cap coming into physical contact with the MEMS wafer.

The wafer cap may be a cover tape wherein the cover tape may comprise a static dissipative material.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A ninth embodiment of the present invention protects a MEMS structure during a production of individual MEMS dies by fabricating a MEMS wafer having a plurality of MEMS structure sites on a first side and a plurality of through holes on a second side; fabricating a wafer cap; bonding the wafer cap to the first side of the MEMS wafer to produce a laminated MEMS wafer, the wafer cap being recessed in areas corresponding to locations of the MEMS structure sites on the MEMS wafer; mounting, upon the second side of the MEMS wafer, a layer of dicing tape; and dicing the laminated MEMS wafer into a plurality of MEMS dies.

The layer of dicing tape may have a UV releasable adhesive, be heat shrinkable, or have a UV releasable adhesive and be heat shrinkable.

The wafer cap may include an adhesive medium, or the wafer cap may be a cover tape with an adhesive medium. The adhesive medium may be an ultraviolet light releasable medium, a heat releasable medium, a combination of an ultraviolet light and heat releasable medium, a thermoplastic organic material, an ultraviolet light sensitive organic material, or a solder material. The wafer cap may be attached to the MEMS wafer through mechanical means or bonds produced by applying the wafer cap to the MEMS wafer with a predetermined amount of pressure.

The wafer cap may comprise silicon-based material, an organic adhesive medium, a glass-based material, a ceramic-based material, a polymer-based material, a metal, or a static dissipative material.

A contiguous tape may be applied to a backside of the MEMS wafer, the backside of the MEMS wafer being a side opposite of a side having the MEMS structure sites located thereon. The contiguous tape may be applied to a backside of the MEMS wafer after the wafer cap is mounted on the MEMS wafer, applied to a backside of the MEMS wafer before the wafer cap is mounted on the MEMS wafer, or applied to a backside of the MEMS wafer before the laminated MEMS wafer is sawn.

The layer of dicing tape may be applied to a second side of the MEMS wafer before or after the wafer cap is mounted on the MEMS wafer. The layer of dicing tape may be applied to a second side of the MEMS wafer before or after the laminated MEMS wafer is sawn.

The wafer cap may be a spacer layer and a wafer cover.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape, an aggregate of the plurality of layers of perforated tape producing the height to prevent electrostatically induced damage to the MEMS wafer and/or to prevent damage to the MEMS structures due to the wafer cap coming into physical contact with the MEMS wafer.

The wafer cap may be a cover tape wherein the cover tape may comprise a static dissipative material.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A laminated MEMS wafer, according to a still further embodiment of the present invention includes a MEMS wafer having a plurality of MEMS structure sites located on a first side and a plurality of through holes located on a second side; a removable wafer cap; and a layer of dicing tape mounted upon the second side of the MEMS wafer. The removable wafer cap is bonded to the first side of the MEMS wafer to produce a laminated MEMS wafer and is recessed in areas corresponding to locations of the MEMS structure sites on the MEMS wafer.

The layer of dicing tape may have a UV releasable adhesive, be heat shrinkable, or have a UV releasable adhesive and be heat shrinkable.

The wafer cap may include an adhesive medium, or the wafer cap may be a cover tape with an adhesive medium. The adhesive medium may be an ultraviolet light releasable medium, a heat releasable medium, a combination of an ultraviolet light and heat releasable medium, a thermoplastic organic material, an ultraviolet light sensitive organic material, or a solder material. The wafer cap may be attached to the MEMS wafer through mechanical means or bonds produced by applying the wafer cap to the MEMS wafer with a predetermined amount of pressure.

The wafer cap may comprise silicon-based material, an organic adhesive medium, a glass-based material, a ceramic-based material, a polymer-based material, a metal, or a static dissipative material.

A contiguous tape may be applied to a backside of the MEMS wafer, the backside of the MEMS wafer being a side opposite of a side having the MEMS structure sites located thereon. The contiguous tape may be applied to a backside of the MEMS wafer after the wafer cap is mounted on the MEMS wafer, applied to a backside of the MEMS wafer before the wafer cap is mounted on the MEMS wafer, or applied to a backside of the MEMS wafer before the laminated MEMS wafer is sawn.

The layer of dicing tape may be applied to a second side of the MEMS wafer before or after the wafer cap is mounted on the MEMS wafer. The layer of dicing tape may be applied to a second side of the MEMS wafer before or after the laminated MEMS wafer is sawn.

The wafer cap may be a spacer layer and a wafer cover.

The spacer layer may comprise a tape having adhesive on two sides and a flexible film or a flexible film with an adhesive medium on one side. The flexible film may be transmissive to UV radiation and may be about 40 mils thick. The spacer layer may also comprise a plurality of layers of perforated tape, an aggregate of the plurality of layers of perforated tape producing the height to prevent electrostatically induced damage to the MEMS wafer and/or to prevent damage to the MEMS structures due to the wafer cap coming into physical contact with the MEMS wafer.

The wafer cap may be a cover tape wherein the cover tape may comprise a static dissipative material.

The flexible film and tape may be combined and then cut to produce areas corresponding to the MEMS structures on the MEMS wafer, cut by a laser to produce areas corresponding to the MEMS structures on the MEMS wafer, or punched to produce areas corresponding to the MEMS structures on the MEMS wafer. The flexible film and tape may be pre-combined and then cut or punched to produce areas corresponding to the MEMS structures on the MEMS wafer or pre-punched or pre-cut individually to produce areas corresponding to the MEMS structures on the MEMS wafer before being combined. The flexible film and tape may be combined using pressure to promote adhesion.

A MEMS wafer, according to the concepts of the present invention, has a plurality of MEMS structure sites located thereon and a removable wafer cap. The removable wafer cap is bonded to the MEMS wafer to produce a laminated MEMS wafer. The wafer cap is recessed in areas corresponding to locations of the MEMS structure sites on the MEMS wafer.

A method for protecting a wafer during a dicing, according to the concepts of the present invention, mounts, upon a backside of a wafer, a layer of dicing tape, the wafer having a front patterned side and a plurality of etched ports on a backside, the etched ports providing a possible leak path from a backside of the wafer to the front patterned side of the wafer; and dices the wafer into a plurality of dies. The wafer may be diced using a saw. The layer of dicing tape may have a UV releasable adhesive, be heat shrinkable, or have a UV releasable adhesive and be heat shrinkable.

A wafer, according to the concepts of the present invention, includes a wafer having a front patterned side and a plurality of etched ports on a backside, the etched ports providing a possible leak path from a backside of the wafer to the front patterned side of the wafer; and a layer of dicing tape mounted upon the backside of the wafer. The layer of dicing tape may have a UV releasable adhesive, be heat shrinkable, or have a UV releasable adhesive and be heat shrinkable.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A method for protecting a MEMS structure during a dicing of a MEMS wafer to produce individual MEMS dies, comprising the steps of:

(a) preparing a MEMS wafer having a plurality of MEMS structure sites on a first side and a plurality of through holes on a second side;

(b) mounting, upon the first side of the MEMS wafer, a wafer cap to produce a laminated MEMS wafer, the wafer cap being recessed in areas corresponding to locations of the MEMS structure sites on the MEMS wafer;

(c) mounting, upon the second side of the MEMS wafer, a layer of dicing tape; and (d) dicing the laminated MEMS wafer into a plurality of MEMS dies.

2. The method as claimed in claim 1, wherein the laminated MEMS wafer is diced using a saw.

3. The method as claimed in claim 2, wherein the layer of dicing tape is applied to a second side of the MEMS wafer before the laminated MEMS wafer is sawn.

4. The method as claimed in claim 2, wherein the layer of dicing tape is cut when the laminated MEMS wafer is sawn.

5. The method as claimed in claim 2, wherein the layer of dicing tape is applied to a second side of the MEMS wafer after the laminated MEMS wafer is sawn.

6. The method as claimed in claim 1, wherein the layer of dicing tape has a UV releasable adhesive.

7. The method as claimed in claim 6, wherein the layer of dicing tape is removed by exposing the dicing tape to UV radiation.

8. The method as claimed in claim 6, wherein the layer of dicing tape is removed by first exposing the dicing tape to UV radiation and then exposing the dicing tape to heat.

9. The method as claimed in claim 1, wherein the layer of dicing tape is heat shrinkable.

10. The method as claimed in claim 9, wherein the layer of dicing tape is removed by exposing the dicing tape to heat.

11. The method as claimed in claim 1, wherein the layer of dicing tape has a UV releasable adhesive and the layer of dicing tape is heat shrinkable.

12. The method as claimed in claim 1, wherein the wafer cap is a cover tape with an adhesive medium.

13. The method as claimed in claim 1, wherein the wafer cap includes an adhesive medium.

14. The method as claimed in claim 13, wherein the adhesive medium is an ultraviolet light releasable medium.

15. The method as claimed in claim 13, wherein the adhesive medium is a heat releasable medium.

16. The method as claimed in claim 13, wherein the adhesive medium is a combination of an ultraviolet light and heat releasable medium.

17. The method as claimed in claim 13, wherein the adhesive medium comprises a thermoplastic organic material.

18. The method as claimed in claim 13, wherein the adhesive medium comprises an ultraviolet light sensitive organic material.

19. The method as claimed in claim 13, wherein the adhesive medium comprises a solder material.

20. The method as claimed in claim 1, wherein the layer of dicing tape is applied to a second side of the MEMS wafer after the wafer cap is mounted on the MEMS wafer.

21. The method as claimed in claim 1, wherein the layer of dicing tape is applied to a second side of the MEMS wafer before the wafer cap is mounted on the MEMS wafer.

22. The method as claimed in claim 1, wherein the wafer cap comprises silicon-based material.

23. The method as claimed in claim 1, wherein the wafer cap comprises a glass-based material.

24. The method as claimed in claim 1, wherein the wafer cap comprises a ceramic-based material.

25. The method as claimed in claim 1, wherein the wafer cap comprises a polymer-based material.

26. The method as claimed in claim 1, wherein the wafer cap comprises a wafer cover and a spacer layer.

27. The method as claimed in claim 26, wherein the spacer layer comprises a tape having adhesive on two sides and a flexible film.

28. The method as claimed in claim 27, wherein the flexible film is transmissive to UV radiation.

29. The method as claimed in claim 26, wherein the spacer layer comprises a flexible film with an adhesive medium on one side.

30. The method as claimed in claim 29, wherein the flexible film is transmissive to UV radiation.

31. The method as claimed in claim 26, wherein the wafer cover is a cover tape.

32. The method as claimed in claim 26, wherein a height of the spacer layer prevents the wafer cover from deflecting in such a manner to come in contact with the MEMS structures.

33. The method as claimed in claim 26, wherein a height of the spacer layer prevents electrostatically induced damage to the MEMS wafer.

34. The method as claimed in claim 26, wherein a height of the spacer layer prevents electrostatically induced damage to the MEMS wafer and prevents the wafer cover from deflecting in such a manner to come in contact with the MEMS structures.

35. The method as claimed in claim 26, wherein the spacer layer comprises a plurality of layers of perforated tape, an aggregate of the plurality of layers of perforated tape producing the height to prevent damage to the MEMS structures due to the wafer cover coming into physical contact with the MEMS wafer.

36. The method as claimed in claim 26, wherein the spacer layer comprises a plurality of layers of perforated tape, an aggregate of the plurality of layers of perforated tape producing the height to prevent electrostatically induced damage to the MEMS wafer.

37. The method as claimed in claim 26, wherein the spacer layer comprises a plurality of layers of perforated tape, an aggregate of the plurality of layers of perforated tape producing the height to prevent damage to the MEMS structures due to the wafer cover coming into physical contact with the MEMS wafer and to prevent electrostatically induced damage to the MEMS wafer.

38. The method as claimed in claim 1, wherein the laminated MEMS wafer is diced with a wafer saw with a dicing tape side of the laminated MEMS wafer facing towards a cutting device of the wafer saw such that the layer of dicing tape is sawn before the MEMS wafer.

39. The method as claimed in claim 1, wherein the wafer cap comprises a metal.

40. The method as claimed in claim 1, wherein the wafer cap comprises a static dissipative material.

41. The method as claimed in claim 1, wherein the dicing tape comprises a static dissipative material.

42. The method as claimed in claim 1, wherein the laminated MEMS wafer is diced with a wafer saw with a wafer cap side of the laminated MEMS wafer facing towards a cutting device of the wafer saw such that the wafer cap is sawn before the MEMS wafer.

43. The method as claimed in claim 1, further comprising the steps of:
(e) removing the layer of dicing tape from the second side of the MEMS wafer; and
(f) removing individual dies from the MEMS wafer.

44. The method as claimed in claim 1 wherein the layer of dicing tape comprises a cover tape and a perforated tape.

45. The method as claimed in claim 44, wherein the cover tape includes an adhesive medium.

46. The method as claimed in claim 45, wherein the adhesive medium is an ultraviolet light releasable medium.

47. The method as claimed in claim 45, wherein the adhesive medium is a heat releasable medium.

48. The method as claimed in claim 45, wherein the adhesive medium is a combination of an ultraviolet light and heat releasable medium.

49. The method as claimed in claim 45, wherein the adhesive medium comprises a thermoplastic organic material.

50. The method as claimed in claim 45, wherein the adhesive medium comprises an ultraviolet light sensitive organic material.

51. The method as claimed in claim 44, wherein the cover tape comprises a static dissipative material.

52. The method as claimed in claim 44, wherein the perforated tape comprises a tape having adhesive on two sides and a flexible film.

53. The method as claimed in claim 52, wherein the flexible film is transmissive to UV radiation.

54. The method as claimed in claim 44, wherein the perforated tape comprises a flexible film with an adhesive medium on one side.

55. The method as claimed in claim 54, wherein the flexible film is transmissive to UV radiation.

56. The method as claimed in claim 44, wherein a height of the perforated tape prevents electrostatically induced damage.

57. The method as claimed in claim 44, wherein the perforated tape comprises a plurality of layers of perforated tape, an aggregate of the plurality of layers of perforated tape producing the height to prevent electrostatically induced damage.

58. A method for protecting a MEMS structure during a dicing of a MEMS wafer to produce individual MEMS dies, comprising the steps of:
(a) fabricating a MEMS wafer having a plurality of MEMS structure sites on a first side and a plurality of through holes on a second side;
(b) fabricating a wafer cap;
(c) bonding the wafer cap to the first side of the MEMS wafer to produce a laminated MEMS wafer, the wafer cap being recessed in areas corresponding to locations of the MEMS structure sites on the MEMS wafer;
(d) mounting, upon the second side of the MEMS wafer, a layer of dicing tape; and
(e) dicing the second side of the laminated MEMS wafer into a plurality of MEMS dies.

59. The method as claimed in claim 58, further comprising the steps of:
(f) removing the wafer cap from the laminated MEMS wafer; and
(g) removing individual dies from the diced laminated MEMS wafer before the wafer cap is removed from the laminated MEMS wafer.

60. The method as claimed in claim 58, further comprising the steps of:
(f) removing the wafer cap from the laminated MEMS wafer;
(g) removing individual dies from the diced laminated MEMS wafer; and
(h) mounting dies from the diced laminated MEMS wafer into a package before the wafer cap is removed from the laminated MEMS wafer.

61. The method as claimed in claim 58, further comprising the steps of:
(f) removing the wafer cap and the layer of dicing tape from the laminated MEMS wafer;
(g) removing individual dies from the diced laminated MEMS wafer; and
(h) mounting dies from the diced laminated MEMS wafer into a package after the wafer cap is removed from the laminated MEMS wafer.

62. The method as claimed in claim 58, wherein the laminated MEMS wafer is diced using a saw.

63. The method as claimed in claim 58, wherein the layer of dicing tape has a UV releasable adhesive.

64. The method as claimed in claim 58, wherein the layer of dicing tape is heat shrinkable.

65. The method as claimed in claim 58, wherein the layer of dicing tape has a UV releasable adhesive and the layer of dicing tape is heat shrinkable.

66. The method as claimed in claim 58, wherein the wafer cap is a cover tape with an adhesive medium.

67. The method as claimed in claim 58, wherein the wafer cap includes an adhesive medium.

68. The method as claimed in claim 67, wherein the adhesive medium is an ultraviolet light releasable medium.

69. The method as claimed in claim 67, wherein the adhesive medium is a heat releasable medium.

70. The method as claimed in claim 67, wherein the adhesive medium is a combination of an ultraviolet light and heat releasable medium.

71. The method as claimed in claim 67, wherein the adhesive medium comprises a thermoplastic organic material.

72. The method as claimed in claim 67, wherein the adhesive medium comprises an ultraviolet light sensitive organic material.

73. The method as claimed in claim 58, wherein the layer of dicing tape is applied to a second side of the MEMS wafer after the wafer cap is mounted on the MEMS wafer.

74. The method as claimed in claim 58, wherein the layer of dicing tape is applied to a second side of the MEMS wafer before the wafer cap is mounted on the MEMS wafer.

75. The method as claimed in claim 58, wherein the wafer cap comprises silicon-based material.

76. The method as claimed in claim 58, wherein the wafer cap comprises a glass-based material.

77. The method as claimed in claim 58, wherein the wafer cap comprises a ceramic-based material.

78. The method as claimed in claim 58, wherein the wafer cap comprises a polymer-based material.

79. The method as claimed in claim 58, wherein the wafer cap comprises a wafer cover and a spacer layer.

80. The method as claimed in claim 79, wherein the spacer layer comprises a tape having adhesive on two sides and a flexible film.

81. The method as claimed in claim 80, wherein the flexible film is transmissive to UV radiation.

82. The method as claimed in claim 79, wherein the spacer layer comprises a flexible film with an adhesive medium on one side.

83. The method as claimed in claim 82, wherein the flexible film is transmissive to UV radiation.

84. The method as claimed in claim 79, wherein the wafer cover is a cover tape.

85. The method as claimed in claim 79, wherein a height of the spacer layer prevents the wafer cover from deflecting in such a manner to come in contact with the MEMS structures.

86. The method as claimed in claim 79, wherein a height of the spacer layer prevents electrostatically induced damage to the MEMS wafer.

87. The method as claimed in claim 79, wherein a height of the spacer layer prevents electrostatically induced damage to the MEMS wafer and prevents the wafer cover from deflecting in such a manner to come in contact with the MEMS structures.

88. The method as claimed in claim 79, wherein the spacer layer comprises a plurality of layers of perforated tape, an aggregate of the plurality of layers of perforated tape producing the height to prevent damage to the MEMS structures due to the wafer cover coming into physical contact with the MEMS wafer.

89. The method as claimed in claim 79, wherein the spacer layer comprises a plurality of layers of perforated tape, an aggregate of the plurality of layers of perforated tape producing the height to prevent electrostatically induced damage to the MEMS wafer.

90. The method as claimed in claim 79, wherein the spacer layer comprises a plurality of layers of perforated tape, an aggregate of the plurality of layers of perforated tape producing the height to prevent damage to the MEMS structures due to the wafer cover coming into physical contact with the MEMS wafer and to prevent electrostatically induced damage to the MEMS wafer.

91. The method as claimed in claim 58, wherein the laminated MEMS wafer is diced with a wafer saw with a dicing tape side of the laminated MEMS wafer facing towards a cutting device of the wafer saw such that the layer of dicing tape is sawn before the MEMS wafer.

92. The method as claimed in claim 58, further comprising the steps of:
(f) removing the wafer cap from the laminated MEMS wafer; and
(g) removing the layer of dicing tape from the laminated MEMS wafer.

93. The method as claimed in claim 92, wherein the layer of dicing tape is removed by exposing the dicing tape to UV radiation.

94. The method as claimed in claim 92, wherein the layer of dicing tape is removed by exposing the dicing tape to heat.

95. The method as claimed in claim 92, wherein the layer of dicing tape is removed by first exposing the dicing tape to UV radiation and then exposing the dicing tape to heat.

96. A method for protecting a MEMS wafer during a dicing, comprising the steps of:
(a) mounting, upon a backside of the MEMS wafer, a layer of dicing tape, the MEMS wafer having a plurality of MEMS structure sites on a front side and a plurality of through holes, each through hole corresponding to a MEMS structure site, the through holes being formed such that each through hole penetrates through the wafer from the backside of the wafer to the front side; and
(b) dicing the MEMS wafer into a plurality of dies such that each die includes a MEMS structure site and a corresponding through hole.

97. The method as claimed in claim 96, wherein the wafer is diced using a saw.

98. The method as claimed in claim 96, wherein the layer of dicing tape has a UV releasable adhesive.

99. The method as claimed in claim 96, wherein the layer of dicing tape is heat shrinkable.

100. The method as claimed in claim 96, wherein the layer of dicing tape has a UV releasable adhesive and the layer of dicing tape is heat shrinkable.

101. The method as claimed in claim 96, further comprising the step of:

(c) removing the layer of dicing tape from the wafer.

102. The method as claimed in claim 101, wherein the layer of dicing tape is removed by exposing the dicing tape to UV radiation.

103. The method as claimed in claim 101, wherein the layer of dicing tape is removed by first exposing the dicing tape to UV radiation and then exposing the dicing tape to heat.

* * * * *